(12) United States Patent
Ono et al.

(10) Patent No.: US 6,762,802 B2
(45) Date of Patent: Jul. 13, 2004

(54) LIQUID CRYSTAL DISPLAY DEVICE AND FABRICATION METHOD THEREOF

(75) Inventors: Kikuo Ono, Mobara (JP); Yoshiaki Nakayoshi, Mobara (JP); Ryutaro Oke, Mobara (JP); Toshiki Kaneko, Chiba (JP)

(73) Assignee: Renesas Technology Corp., Tokyo (JP)

( * ) Notice: Subject to any disclaimer, the term of this patent is extended or adjusted under 35 U.S.C. 154(b) by 84 days.

(21) Appl. No.: 09/851,942

(22) Filed: May 10, 2001

(65) Prior Publication Data

US 2001/0040648 A1 Nov. 15, 2001

(30) Foreign Application Priority Data

May 12, 2000 (JP) .................................. 2000-144586

(51) Int. Cl.⁷ ...................... G02F 1/136; G02F 1/1343
(52) U.S. Cl. ............................................ 349/38; 349/43
(58) Field of Search ........................... 349/38, 43, 140, 349/158

(56) References Cited

U.S. PATENT DOCUMENTS

| | | | | |
|---|---|---|---|---|
| 5,760,856 A | | 6/1998 | Yanagawa et al. | |
| 6,001,539 A | * | 12/1999 | Lyu et al. | 430/317 |
| 6,038,003 A | * | 3/2000 | Kim | 349/43 |
| 6,091,466 A | * | 7/2000 | Kim et al. | 349/43 |
| 6,243,146 B1 | * | 6/2001 | Rho et al. | 349/42 |
| 2001/0010576 A1 | | 8/2001 | Lee et al. | |

FOREIGN PATENT DOCUMENTS

| | | |
|---|---|---|
| JP | 8-88368 | 9/1994 |
| JP | 10-163174 | 11/1996 |
| JP | 10-206866 | 1/1997 |

* cited by examiner

*Primary Examiner*—Robert H. Kim
*Assistant Examiner*—Thoi V. Duong
(74) *Attorney, Agent, or Firm*—Reed Smith LLP; Stanley P. Fisher, Esq.; Juan Carlos A. Marquez, Esq.

(57) ABSTRACT

The present invention provides a novel photolithography processes using photoresist pattern having at least two areas which has different thickness from each other for a fabrication method for a liquid crystal display device having reversed staggered and channel-etched type thin film transistors, reduce a number of photolithography processes required for whole of the fabrication process of the liquid crystal display device, and improve brightness of the liquid crystal display device.

4 Claims, 19 Drawing Sheets

LIQUID CRYSTAL DISPLAY DEVICE AND FABRICATION METHOD THEREOF

BACKGROUND OF THE INVENTION

1. Field of the Invention

The present invention relates to a liquid crystal display device and, for example, to one of a pair of substrates between which a liquid crystal layer is interposed, i.e., a so-called TFT substrate on which thin film transistors (hereinafter referred to as TFTs) are formed, as well as to a fabrication method for such a TFT substrate.

2. Description of the Related Art

In the case of a related art liquid crystal display device, as described in Japanese Patent Laid-Open No. 202153/1994, its TFT substrate is fabricated by forming openings in the gate insulating film and the protective film laminated on the TFT substrate, through one photo-process (a process which includes the photolithography of forming a photomask on a work and partly removing the photomask according to a processing pattern), and carrying out patterning through a total of five photo-processes. In the TFT substrate obtained by this fabrication method, a charge holding capacitor for the TFT provided in each pixel includes a metal electrode which is formed in the same process as and of the same material as gate wiring lines and serves as a lower electrode, a metal electrode which is formed in the same process as and of the same material as signal lines for the TFT and serves as an upper electrode, and a dielectric which is disposed between the lower and upper electrodes. As the dielectric, a gate insulating film, a nondoped semiconductor (an i-type semiconductor; also called an intrinsic semiconductor) and a semiconductor containing an impurity (also called an $n^+$-type semiconductor according to the conduction type of the impurity) are constructed in the form of a laminated film. The upper electrode of the charge holding capacitor is connected to a pixel electrode made of a transparent conductive film via a through-hole formed in the protective film of the TFT.

In addition, as described in Japanese Patent Laid-Open No. 232409/1998, there is a fabrication method which forms through five photo-processes a TFT substrate provided with thin film transistors each of which is of the reversed staggered type (the type in which a semiconductor layer serving as a channel is disposed on the gate electrode of a transistor) and has a channel etch structure (a structure in which a portion serving as the channel of the semiconductor layer is partly thinned by etching or the like).

In addition, there is an art which fabricates a TFT substrate for an In-Plane-Switching (hereinafter, IPS) mode of liquid crystal display device through four photo-processes by using the above-described fabrication method.

In another related art liquid crystal display device, as described in Japanese Patent Laid-Open No. 90404/1997, the upper electrode of each charge-holding capacitor is made of a metal electrode formed in the same process as and of the same material as its gate wiring lines, and the lower electrode of the charge-holding capacitor is made of a transparent electrode deposited in the same process as a metal film for signal lines of each TFT. The dielectric of the charge holding capacitor is made of a gate insulating film, and an opening (a through-hole) is formed in a protective film made of an organic material formed on the upper electrode of the charge-holding capacitor, and the upper electrode and the pixel electrode are connected to each other via the opening.

SUMMARY OF THE INVENTION

According to the arts disclosed in Japanese Patent Laid-Open No. 202153/1994 and Japanese Patent Laid-Open No. 232409/1998, at least five times of patterning (five photo-processes) are needed during the processing of the TFT glass substrate of the liquid crystal display device. Moreover, in Japanese Patent Laid-Open No. 232409/1998, although the TFT glass substrate of a lateral electric field type, i.e., the IPS display mode, of liquid crystal display device is formed through four photo-processes, the terminals of its gate and drain wiring lines are not coated with a transparent conductive film such as Indium-Tin-Oxide (hereinafter, ITO), so that the terminals suffer the problem of electrical corrosion due to humidity. In addition, since comb-teeth like pixel (source) electrodes are disposed close to the gate wiring lines, there is the problem that parasitic capacitance becomes large.

The dielectric of the charge holding capacitor described in Japanese Patent Laid-Open No. 202153/1994 has the laminated structure in which the i-type semiconductor and the $n^+$-type semiconductor are laminated on the gate insulating film. Therefore, during charging for driving the TFT type liquid crystal display device, the potential of the lower electrode of the charge holding capacitor becomes higher than that of the upper electrode of the charge holding capacitor and electrons are injected into the i-type semiconductor film from the lower electrode, so that the capacitance value is determined by the thickness of the gate insulating film. During a charge-holding period in such driving, electrons are emitted from the i-type semiconductor and the capacitance value fluctuates and lowers to a capacitance value which is a value for the thickness of the i-type semiconductor, resulting in the problem that image retention occurs in the liquid crystal.

The TFT liquid crystal display device described in Japanese Patent Laid-Open No. 90404/1997 has the protective film made of the organic material, and the drain wiring lines are used as light-shielding electrodes, and pixel electrodes are disposed to overlap the drain wiring lines above the organic protective film of low dielectric constant, thereby improving the aperture ratio. However, patterning processing needs at least five photo-processes.

An object of the invention is to simplify a fabrication process for a TFT substrate compared to the above-described fabrication methods for the related art liquid crystal display devices. Another object of the invention is to improve the display contrast of a liquid crystal display device by forming a wiring structure which has high accuracy and can prevent drain wiring lines from being easily disconnected, by employing the simplified fabrication method. A further object of the invention is to increase the capacitance value per unit area of a charge holding capacitor provided in each pixel of a liquid crystal display device and increase the aperture ratio of the pixel, by using the simplified fabrication method.

Another object of the invention is to use a simple fabrication method which decreases the capacitance difference in charge-holding capacitance between on-switching and off-switching during the driving of a liquid crystal display device and so reduce image retention. A further object of the invention is to reduce the parasitic capacitance between gates and pixel (source) electrodes in IPS display mode.

To achieve the above objects, the invention provides a liquid crystal display device having a novel wiring structure.

One example of liquid crystal display devices according to the present invention comprises:

a first insulating substrate and a second substrate being disposed so that respective main surfaces thereof are opposite to one another;

a liquid crystal layer being interposed between the first and second insulating substrates;

gate wiring lines being formed on the first insulating substrate and transmitting scanning signals;

a gate insulating film being composed of the first insulating substrate and the gate wiring lines;

drain wiring lines being composed of metal films formed on the gate insulating film and transmitting video signals;

semiconductor layers being formed on the gate insulating film and at least under the drain wiring lines;

thin film transistor sections, each of which has (1) a semiconductor channel layer composed of a part of the semiconductor layer located at least over a part of the gate wiring layer, (2) a drain electrode composed of a part of the drain wiring line located on the semiconductor channel layer and a semiconductor contacting layer formed of a part of the semiconductor layer being contacted with the part of the drain wiring lines, (3) a source electrode composed of another metal film formed on the semiconductor channel layer to be spaced from and opposite to the drain electrode and another semiconductor contacting layer formed of another part of the semiconductor layer being contacted with a lower surface of the another metal film, and (4) a protective film covering the drain wiring lines, the source electrode, and the drain electrode; and pixel electrode sections, each of which has a pixel electrode being contacted with the source electrodes, wherein (a) a planar pattern of each of the semiconductor layers is broader than those of the metal layers of the drain wiring layer, the source electrodes, and the drain electrodes formed thereon, and (b) a planar pattern of each of the semiconductor layers other than the semiconductor contacting layers formed therein is broader than those of the semiconductor contacting layers. The aforementioned semiconductor channel layer and the aforementioned semiconductor contacting layer often designate specific parts of the semiconductor layer. Namely, neither the semiconductor channel layer nor the semiconductor contacting layer should be limited to be interpreted as layers other than the semiconductor layer, and thus the semiconductor layer is allowed to have a stacked structure of the semiconductor channel layer and the semiconductor contacting layer being formed therein between the gate insulating film and the drain electrode, for instance. Preferably, the semiconductor channel layer should be formed of an intrinsic semiconductor layer (without impurities doped intentionally therein) and the semiconductor contacting layer should be formed of an impurity (e.g. n-type)-doped semiconductor layer. These definitions of the semiconductor channel layer and the semiconductor contacting layer are also applied to following examples and embodiments.

Another example of liquid crystal display devices according to the present invention comprises:

a first insulating substrate and a second insulating substrate disposed to be opposite to the first insulating substrate;

a liquid crystal layer being interposed between the first insulating substrate and the second insulating substrate;

a plurality of gate wiring lines, each of which is formed on the first insulating substrate and transmits a scanning signal;

a gate insulating film being formed on the first insulating substrate and the plurality of gate wiring lines;

a plurality of drain wiring lines, each of which is formed on the gate insulating film and transmits a video signal;

a plurality of semiconductor layers being formed on the gate insulating film and at least under one of the plurality of drain wiring lines;

thin film transistor sections, each of which has (1) a semiconductor channel layer formed of a part of the one of the plurality of semiconductor layers extended at least over a part of one of the plurality of gate wiring lines, (2) a drain electrode formed of a part of the one of the plurality of drain wiring lines situated on the semiconductor channel layer, (3) a source electrode formed on the semiconductor channel layer at an opposite side of the part of the one of the plurality of gate wiring lines to the drain electrode to be spaced from the drain electrode;

a protective film covering the plurality of drain wiring lines, the source electrodes, and the drain electrodes;

a plurality of pixel electrodes, each of which is contacted with the source electrode of one of the thin film transistor sections; and charges-holding capacitance sections, each of which has an upper electrode connected to one of the pixel electrode and a lower electrodes formed of the gate wiring line or a material thereof (metallic material, alloy material, or the like), wherein, (c) a dielectric film being interposed between the lower electrode and the upper electrode of each of the holding capacitance sections has a stacked layer structure formed of the gate insulating film and the semiconductor layer, and (d) each of the pixel electrodes is contacted with one of the semiconductor layers through a contact hole provided by perforating the protective film.

Moreover, an example of liquid crystal display device according to the present invention other than the aforementioned two examples thereof comprising:

a liquid crystal layer being interposed between a first insulating substrate and a second insulating substrate provided to be opposite to the first insulating substrate;

gate wiring lines formed on the first insulating substrate and transmitting scanning signals;

a gate insulating film formed on the first insulating substrate and the gate wiring lines;

drain wiring lines being composed of metal layers formed on the gate insulating film and transmitting video signals;

semiconductor layers, each of which is formed on the gate insulating film and is provided at least under one of the drain wiring lines;

thin film transistor sections, each of which has (1) a semiconductor channel layer formed of a part of one of the semiconductor layers located over a part of one of the gate wiring lines, (2) a drain electrode formed of a part of the drain wiring lines located on the semiconductor channel layer, (3) a source electrode being formed on the semiconductor channel layer to be opposite to and spaced from the drain electrode;

a protective film being formed over at least one of the drain wiring lines, the source electrode, and the drain electrode; and pixel sections, each of which has at least one pixel electrode being connected to the source electrode and at least one of common electrode being spaced from the at least one pixel electrode in a plane along at least one of main surfaces of the first and second insulating substrates, wherein (e) semiconductor contacting layers are formed in each of the semiconductor layers along respective interfaces thereof contacting metal layers of the one of the drain wiring lines, the source electrode, and the drain electrode, and (f) the at least one pixel electrode is formed as three layered structure having the semiconductor layer, the semiconductor contacting layer, and a metal layer of either the drain wiring line or the source electrode being stacked in this order on the gate insulating film. This example also enables to generate an electric field having a component thereof substantially parallel to at least one of the main surface of the first and second insulating substrates in the liquid crystal layer by applying a voltage between the pixel electrode and the common electrode in accordance with the aforementioned structure of the pixel section. The liquid crystal display device displaying an image by controlling optical transmissivity of the liquid crystal layer in such a manner is called as the In-Plane-Switching (IPS) type.

In any of the above-described examples, the drain wiring lines, the source electrodes and the drain electrodes are in many cases formed of a metal, an alloy or a similar material. Three films, i.e., a metal film which constitutes the drain wiring lines, the source electrodes and the drain electrodes, a film which constitutes an $n^+$-type semiconductor underlying the metal film, and a film which constitutes an i-type semiconductor underlying the $n^+$-type semiconductor, are integrated into a pattern for the drain wiring lines. The metal film is made wider in line width than the $n^+$-type semiconductor, and the i-type semiconductor is made wider in line width than the $n^+$-type semiconductor, whereby the resultant steps are arranged in a staircase-like shape on the gate insulating film.

By distributing the line width of each of the films in this manner, the tensile stress of the metal film is canceled by the compressive stress of the semiconductor films, thereby preventing disconnection of the drain wiring lines at steps produced on the main surface of the substrate by the gate wiring lines. Moreover, the steps of the wiring lines are formed into a staircase-like shape, thereby dispersing and moderating the difference in height to maintain the coverage of the overlying protective film (the coating ratio of the protective film). Thus, shades due to rubbing during a liquid crystal alignment process are reduced and contrast is improved.

In addition, the liquid crystal display device according to the invention adopts a new charge-holding capacitance structure. The lower electrode of each charge holding capacitor is made of a metal electrode formed in the same process as and of the same material as gate wiring lines, and the upper electrode of the charge holding capacitor is made of a transparent conductive film which is present on a protective film and covers the openings of the protective film, and a laminated film made of a gate insulating film and an i-type semiconductor film or only the gate insulating film is used as a dielectric. The i-type semiconductor or the gate insulating film is directly connected to the transparent conductive film.

In addition, the liquid crystal display device according to the invention can adopt another charge-holding capacitance structure. The upper electrode of each charge holding capacitor is made of a transparent conductive film disposed on a protective film and connected through an opening of the protective film to a metal electrode formed in the same process as and of the same material as gate wiring lines, and the lower electrode of the charge holding capacitor is made of a metal electrode formed in the same process as and of the same material as drain wiring lines, and a protective insulating film is used as a dielectric.

According to the liquid crystal display device according to the invention, a new structure is adopted for the pixel electrodes of the IPS type liquid crystal display device. Each pixel electrode is formed as a three-layer structure made of an $n^+$-type semiconductor, an i-type semiconductor and a metal film over a gate insulating film, and the steps of the pixel electrode are formed in a staircase-like shape so as to widen the lower section thereof. Owing to this structure, the parasitic capacitance between gate wiring lines and source electrodes is reduced.

The increase in the capacitance value per unit area of the above-described charge holding capacitor according to the invention makes it possible to narrow the widths of the gate wiring lines, the charge holding capacitor wiring lines or the common electrode wiring lines of the IPS liquid crystal display device, thereby improving the aperture ratio of each pixel of the liquid crystal display device.

To achieve the above objects, there is provided a new fabrication method which forms a TFT substrate through four photo-processes. The first is patterning gate wiring metal, the second is patterning a metal film for drain wiring lines and a semiconductor film, the third is patterning of openings in a protective film overlying the drain wiring lines, and the fourth is patterning pixel electrode on the protective film or a transparent conductive film having a particular function.

In the above-described fabrication method, the semiconductor film can use amorphous silicon (hereinafter, a-Si). In this fabrication method, the exposure and development of a photoresist for patterning the metal films of the drain wiring lines and the source and drain electrodes of TFTs as well as $n^+$-type a-Si semiconductors and i-type s-Si semiconductors are carried out through one process. After the completion of the one exposure and development process, the drain metal is divided into the area in which a photoresist is absent, the area in which a thick photoresist is present and the area in which a thin photoresist is present.

A photomask for realizing the photoresist having such two different thicknesses through one exposure and development process has a construction having two metal film areas having different optical transmissivities, or a construction made of an aggregate area which has one nontransparent (opaque) metal film area and another nontransparent metal film area having slits or holes of 1–4 $\mu$m.

The substrate which has, in addition to the photoresist area having such two different thicknesses, the metal film having the area in which a photoresist is absent, the $n^+$-type a-Si film underlying the area, the i-type a-Si film underlying the $n^+$-type a-Si film and a SiN film underlying the i-type a-Si film is processed in the following sequence, and is separated into the drain wiring lines, the source and drain metals and the channel areas (i-type a-Si) of TFTs. The sequence includes removing the metal from the area having no photoresist by etching, selectively removing the $n^+$-type a-Si film and the i-type a-Si film from the gate SiN film, removing the thin photoresist area by oxygen ashing with the thick photoresist area being left, again removing the metal film by etching, and removing the $n^+$-type a-Si film having no metal film.

By using a photomask having three areas having different optical transmissivities, it is possible to process drain wiring lines, source electrodes and drain electrodes and s-Si films through one photo-process for exposure and development, whereby it is possible to simplify the entire process. In addition, the number of photo-processes per TFT substrate can be reduced to four.

Although the metal films of the drain wiring lines, the source electrodes and the drain electrodes are removed through two separate etching processes, it is possible to improve the processing accuracy of the drain wiring lines by performing dry etching as the first process and wet etching as the second process.

The metal film of the drain wiring lines is preferably a single film made of a metal containing Mo or a metal containing Ta, Ti or W, or a laminated film of these metals.

To realize another object of the invention, there is provided a new fabrication method for a charge holding capacitor. An i-type a-Si film formed as a dielectric for a charge holding capacitor and a protective film formed on the i-type a-Si film and made of SiN are removed by etching with an aqueous solution containing hydrofluoric acid and ammonium fluoride (a buffer solution of hydrofluoric acid), then the i-type a-Si film is selectively removed from a gate insulating film SiN by dry etching, and subsequently a transparent conductive film such as Indium-Tin-Oxide (hereinafter, ITO) is deposited to be a lid over openings of the protective film.

In the case where two films, i.e., a film made of SiN and a film made of an organic material, are used as the aforementioned protective film, it is possible to adopt another fabrication method for processing the SiN protective film and the organic-material protective film which overlie the i-type a-Si film of a charge-holding dielectric section. A photosensitive material is used as the organic material, and a pattern having openings with respect to the underlying film is formed by exposure and development, and this organic material itself is used as a mask pattern to remove the protective film SiN by etching with a buffer solution of hydrofluoric acid, and heat treatment which extends the organic material inwardly of the openings is performed at a treatment temperature of 150–200° C. After that, a transparent conductive film such as ITO is deposited to be a lid over the openings of the protective film.

In the above-described fabrication method, the i-type a-Si film may also be removed by etching before or after the heat treatment of the organic material.

By using the fabrication method for the charge holding capacitor, it is possible to form the dielectric of the charge holding capacitor with a gate insulating film or a laminated structure of the gate insulating film and the i-type a-Si film, whereby the capacitance value per unit area is increased and hence the aperture ratio is increased. In addition, even if the i-type a-Si film is directly connected to ITO, the contact resistance is high, so that electrons are not injected and image retention does not occur.

These and other objects, features and advantages of the present invention will become more apparent from the following description when taken in conjunction with the accompanying drawings.

DETAILED DESCRIPTION

Embodiments of the invention will be described with reference to the accompanying drawings. Incidentally, in each of the following embodiments, amorphous silicon (a-Si) is used as a representative example of semiconductor film and ITO is used as a representative example of transparent conductive film, but instead, semiconductor film such as polycrystalline silicon and transparent conductive film such as indium zinc oxide (IZO) maybe used. Scanning lines and video signal lines which are wiring lines for TFTs are herein called gate wiring lines and drain wiring lines, respectively. The source and drain electrodes of each pixel of the liquid crystal display device cannot be easily defined, because each TFT is driven by AC power and the source and drain electrodes are electrically switched, but in the following description, the electrode section of each TFT that is connected to a drain wiring line is called the drain electrode, and the electrode section of the TFT that is connected to a pixel electrode with its channel length region interposed therebetween is called the source electrode. A charge-holding capacitance is also called storage capacitance, added capacitance or the like, but in the following description of the invention, the term "charge-holding capacitance" is used.

Embodiment 1

Figure 1:
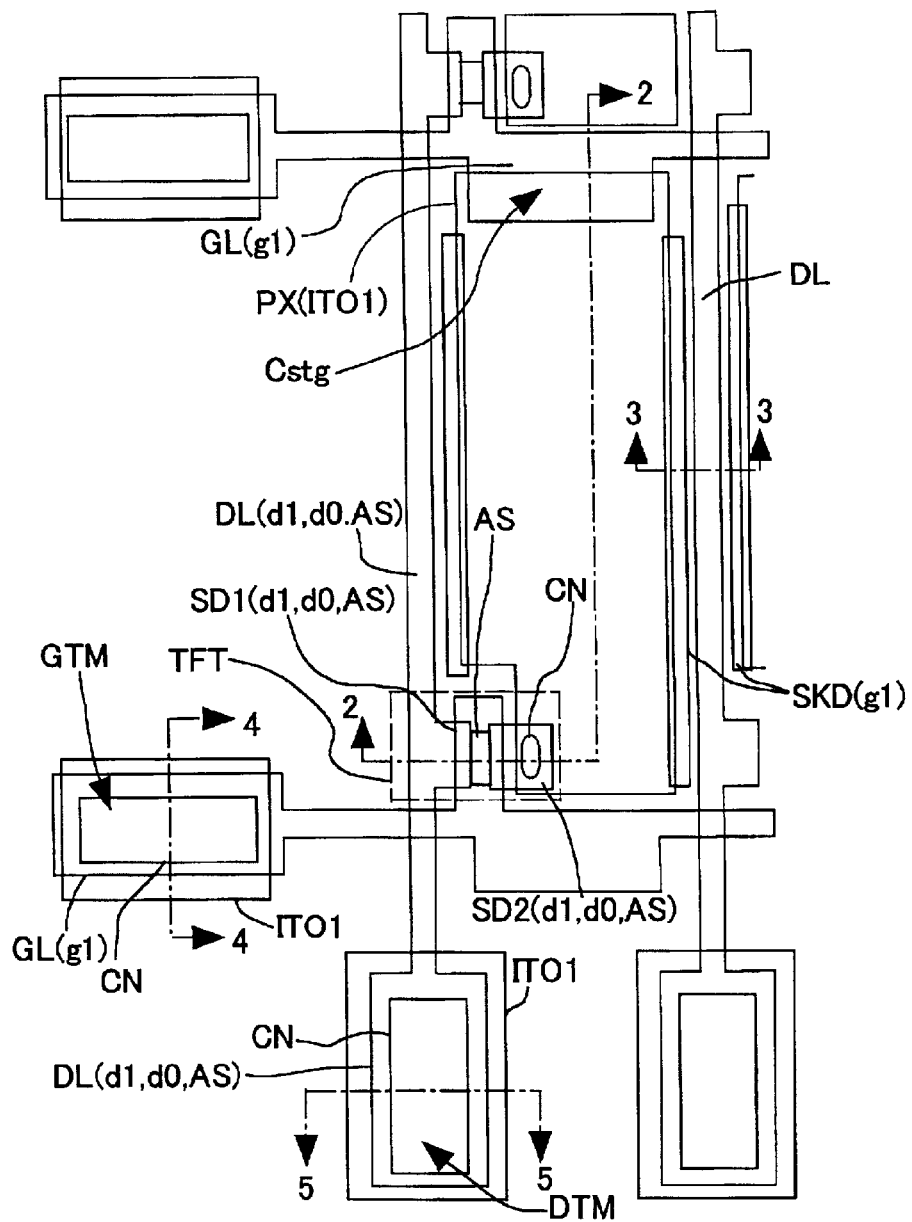
FIG. 1 is a plan view showing a TFT substrate of a liquid crystal display device according to Embodiment 1 of the invention.
Figure 2:
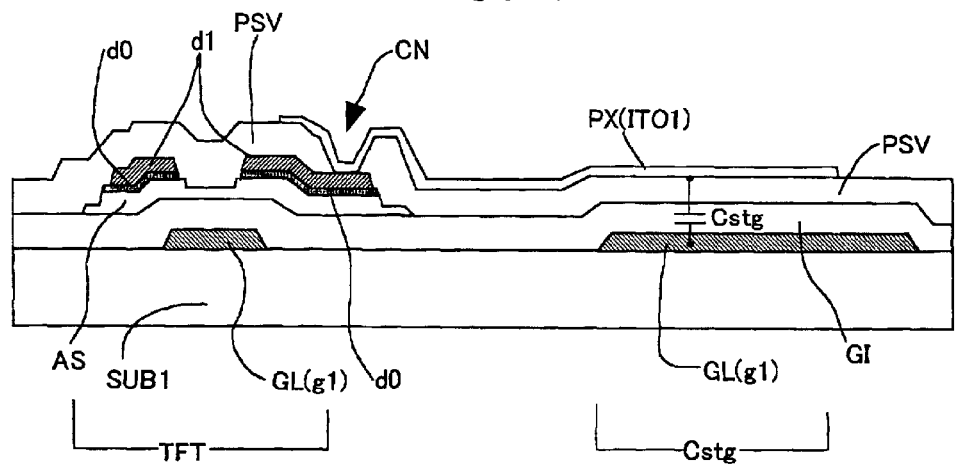
FIG. 2 is a cross-sectional view taken along line 2—2 of FIG. 1.
Figure 3:
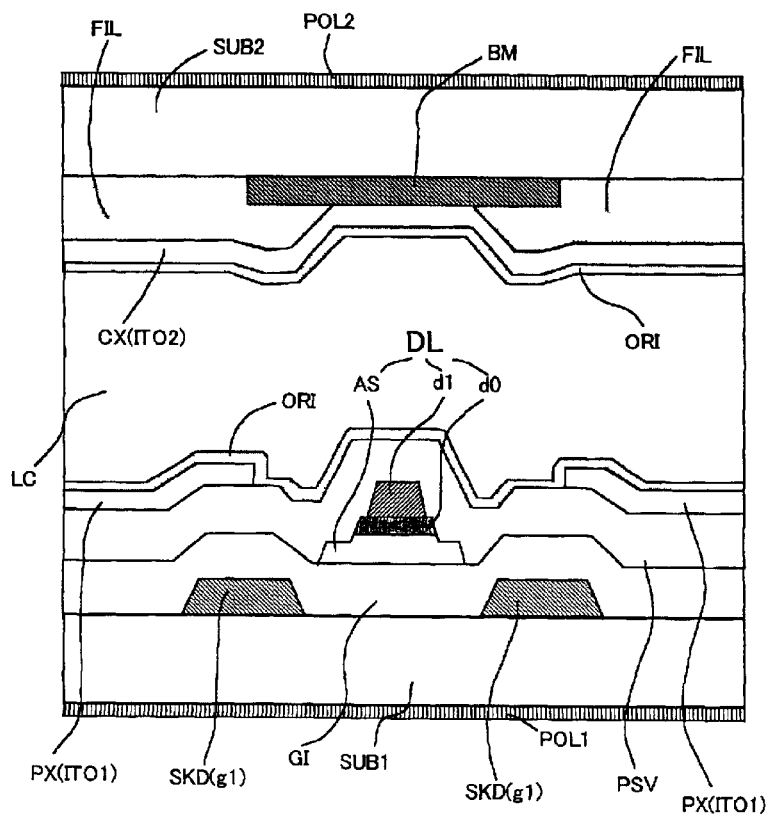
FIG. 3 is a cross-sectional view showing a cross section of the TFT substrate taken along line 3—3 FIG. 1 as well as a cross section of a color filter substrate opposite to the TFT substrate, and showing the vicinity of a drain wiring line in the TFT liquid crystal display device according to Embodiment 1 of the invention.
Figure 4:
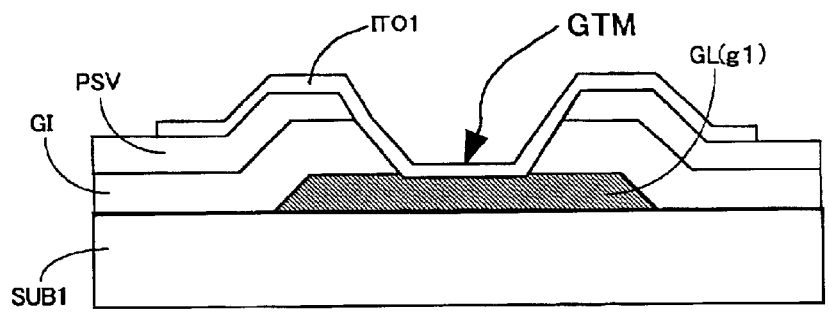
FIG. 4 is a cross-sectional view taken along line 4—4 of FIG. 1.
Figure 5:
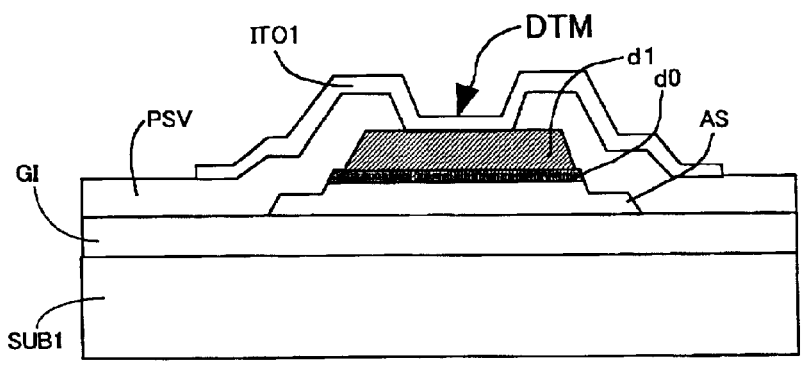
FIG. 5 is a cross-sectional view taken along line 5—5 of FIG. 1.

FIG. 1 is a plan view showing a TFT substrate of a type according to Embodiment 1 of the invention. FIG. 2 is a cross-sectional view taken along line 2—2 of FIG. 1, showing a portion which extends from a TFT to a charge-holding capacitance portion Cstg through a pixel electrode PX. FIG. 3 is a cross-sectional view taken along line 3—3 of FIG. 1, showing a drain wiring line section. FIG. 4 is a cross-sectional view taken along line 4—4 of FIG. 1, showing a gate wiring line section. FIG. 5 is a cross-sectional view taken along line 5—5 of FIG. 1, showing a drain wiring line section. FIGS. 6A to 9B are cross-sectional views showing a fabrication method for the TFT substrate according to Embodiment 1 in the order of steps (from photoresist application to resist stripping) of a photo-process which is basically patterning, the respective steps corresponding to FIGS. 6A and 6B; 7A to 7D; 8A and 8B; and 9A and 9B.

In the TFT section of the liquid crystal display device, as shown in FIG. 2 in cross section, a gate wiring line GL made of a metal film g1 in which, for example, Mo (molybdenum) is stacked on Mo, Cr (chromium) or Al (aluminum) is formed on a transparent insulating substrate SUB1 such as a glass substrate. An a-Si channel film AS using i-type a-Si is formed over this gate wiring line GL with a gate insulating film GI interposed therebetween, where the gate insulating film GI is made of an SiN film or a stacked film composed of an $SiO_2$ film and an SiN film. Furthermore, a drain electrode SD1 and a source electrode SD2 each made of Mo, Cr or a stacked layer of Mo, Al and Mo are formed over this a-Si channel film AS on both sides thereof in the state of being opposite to each other with a contact film d0 using an $n^+$-type a-Si film being interposed between the a-Si channel film AS and the drain electrode SD1 as well as between the a-Si channel film AS and the source electrode SD2. This drain electrode SD1 constitutes part of the video signal line DL. The a-Si contact layer d0 and the a-Si channel film AS are partly removed by etching from above the portion between the drain electrode and the source electrode in order to increase the off resistance of TFT operation, whereby the thickness of the a-Si channel film AS in this region is set to be smaller than the thickness of the a-Si channel film AS excluding the a-Si contact layer d0 lying under the drain electrode SD1 and the source electrode SD2. Moreover, a contact hole CN is formed in a protective film PSV made of an SiN film covering the TFT, and a transparent conductive film ITO1 made of ITO is connected to the source electrode SD2 through the contact hole CN and constitutes the pixel electrode PX.

In the construction of this TFT section, one problem to be solved in terms of manufacturing yield factor is that the material of the transparent conductive film ITO1 which constitutes the pixel electrode PX, for example, ITO, does not have sufficient adhesion to the stepped undersurface, so that the transparent conductive film ITO1 may be easily disconnected during etching processing. Particularly in the cross-sectional structure shown in FIG. 2, the source electrode SD2 that lies near the contact hole CN has a large stepped interval because the a-Si films AS and d0 and the metal electrode d0 are stacked. In Embodiment 1, the a-Si contact film d0 projects from an overlying metal material d1 which constitutes the drain electrode SD1, and the a-Si channel film AS projects from the overlying a-Si contact film d0. The resultant steps constitute a staircase-like structure which is formed by the metal material d1, a semiconductor film including the a-Si contact film d0, and the portion of the a-Si channel film AS that is made thin by etching. The protective film PSV which is formed over the staircase-like structure has a gentle shape so that the transparent conductive film ITO1 is not at all disconnected.

In the section of the charge-holding capacitance Cstg, as shown in FIGS. 1 and 2, the pixel electrode PX made of the transparent conductive film ITO1 is extended to overlap the adjacent gate wiring line GL. Therefore, the charge-holding capacitance Cstg has an upper electrode made of the transparent conductive film ITO1 which constitutes the pixel electrode PX, a lower electrode made of the electrode g1 which constitutes the gate wiring line GL, and a dielectric film having a stacked structure made of the gate insulating film GI and the protective film PSV.

As shown in FIGS. 1 and 3, the signal line DL has the function of mainly transmitting a video signal voltage, and is composed of the metal film d1 made of a Mo—Cr alloy or a stacked layer in which Mo, Al and Mo are stacked in this order, and the a-Si contact films d0 and AS. The cross-sectional structure of the signal line DL has a staircase-like shape similar to the source electrode SD2, and the a-Si channel film AS projects from the metal film d1. Light shielding electrodes SKD which are formed of the same material as and in the same step as the gate wiring line GL are disposed below both sides of the video signal line DL, respectively. The light shielding electrodes SKD have the effect of blocking the gap between the pixel electrode PX and the video signal line DL, and is capable of narrowing the width of a black matrix BM made of a metal or a resin of low optical transmissivity formed on a color filter substrate SUB2 which is a substrate disposed to be opposite to the TFT substrate SUB1 across a liquid crystal LC interposed between alignment films ORI. In this manner, the light shielding electrodes SKD makes it possible to increase the aperture ratio, thereby realizing a bright liquid crystal display device (having a pixel with high optical transmissivity). In FIG. 3, symbol FIL denotes a color filter, and symbol CX denotes a counter (common) electrode using an electrode ITO2 made of a transparent conductive film such as ITO. Polarizer films POL are fitted to the outer surfaces of the respective TFT substrates SUB1 and SUB2.

The following effects are obtained from the structure of the video signal line DL which is not simply made of the metal film d1 alone but has staircase-like steps made of the metal film d1, the a-Si contact film d0 and the a-Si channel film AS, respectively. As the metal film d1, Cr can also be used, but Al or Mo is preferable as a material of low resistivity. However, during the etching of the transparent conductive film ITO1 of the pixel electrode PX which is located at the top of the cross-sectional structure shown in FIG. 3, Al is easily dissolved through a pinhole in the protective film PSV by an aqueous solution of HBr or Hl which is an etching chemical, thus resulting in disconnection. For this reason, in the case where the resistivity of CR does not suffice, either a single MO film resistant to the etching chemical or a wiring metal structure in which an Al layer is sandwiched between upper and lower Mo layers is selected. On the other hand, Mo does not have good adhesion to an insulating film. Since Mo has high adherence to an a-Si film because Mo and the a-Si film form silicide, the a-Si contact film d0 which is a semiconductor is formed under the metal film d1. On the other hand, in the case where the films d0 and AS which are semiconductor films are deposited by an apparatus different from that for the metal film d1 and are processed by using a so-called photo-process, if the semiconductor films d0 and AS and the metal film d1 are subjected to different photo-processes, the width of the structure of the video signal line DL becomes large due to a deviation in alignment between the photo-processes, so that the aperture ratio decreases, resulting in a dark liquid crystal display device. Moreover, at the time of the rubbing of the upper portion of the alignment film ORI as viewed in FIG. 3, a structure having gentle steps is needed. As a result, it is preferable that the steps formed by the metal film d1, the a-Si contact film d0 and the a-Si channel film AS constitute a staircase-like structure, and in terms of a fabrication method, as will be described later in detail, it is preferable to continuously deposit the a-Si channel film AS, the a-Si contact film d0 and the source and drain metal film d1 and process these films from above by a single photoresist process. In Embodiment 1, this method is used.

Another problem to be solved in terms of manufacturing yield factor is the disconnection of the video signal line DL which intersects a plurality of gate wiring lines GL as shown in FIG. 1. Such disconnection will be described with reference to the cross-sectional view of FIG. 2. A material such as Cr or Mo is used for the metal film D1 which constitutes the video signal line DL (the drain electrode SD1). Depending on deposition conditions, tensile stress occurs in such material. Since the video signal line DL is tensed in its lengthwise direction (in a direction perpendicular to the extending direction of the gate wiring lines GL; refer to FIG. 1), the video signal line DL is disconnected at any of the steps of the underling gate wiring lines GL. On the other hand, the i-type a-Si film AS has compressive stress, so that if the a-Si film AS is formed under the metal film d1 which constitutes the video signal line DL, the stress is relaxed. Moreover, since the stress of the metal film d1 is on the same order as the stress of the a-Si channel film AS, the width of the a-Si channel film AS is preferably made equal to or slightly larger than the width of the metal film d1.

As shown in FIGS. 1 and 4, a terminal section GTM of the gate wiring line GL has a structure in which a lower gate terminal electrode is made of the electrode g1 which constitutes a film common to the gate wiring line GL formed on the TFT substrate SUB1, and the gate insulating film GI and the protective film PSV are formed over the electrode g1, and an upper gate terminal electrode which is made of the transparent conductive film ITO1 of the same material as the pixel electrode PX is stacked on the electrode g1 via a through-hole formed in the stacked film made of the films GI and PSV.

As shown in FIGS. 1 and 5, a terminal section DTM of the drain wiring line DL has a structure in which the metal film d1, the a-Si contact film d0 and the a-Si channel film AS are formed in a staircase-like shape similar to that of the video signal line DL, and the protective film PSV for the TFT is formed over the films d1, d0 an AS, and the transparent conductive film ITO1 which is made of the same material as the pixel electrode PX formed on the protective film PSV is formed on the metal film via a through-hole formed in the protective film PSV. In this structure, the a-Si contact film d0 and the a-Si channel film AS which are semiconductor films acts to improve the adherence between the metal film d1 and the gate insulating film GI both of which use, for example, Mo. The display-area sides of the gate terminals GTM and the drain terminals DTM are respectively supplied with the voltages required to be supplied to the gate wiring lines GL and the video signal lines DL for the purpose of displaying, and the gate terminals GTM and the drain terminals DTM are connected to external control circuits.

A fabrication method for the TFT substrate of the reversed staggered type TFT display device shown in FIG. 2 will be described below with reference to the cross-sectional process diagrams of FIGS. 6A to 9B. Each sheet of FIGS. 6A to 9B approximately corresponds to one photo-process, and processes which are basically photo-patterning, i.e., thin film deposition, photoresist application, exposure, development and thin film patterning, will be described below as one photo-process. The illustration of a photoresist stripping step is omitted in FIGS. 6A to 9B. The detailed procedures of each photo-process are represented by the cross-sectional views of the corresponding FIGS. 6A to 9B.

Figure 6A:
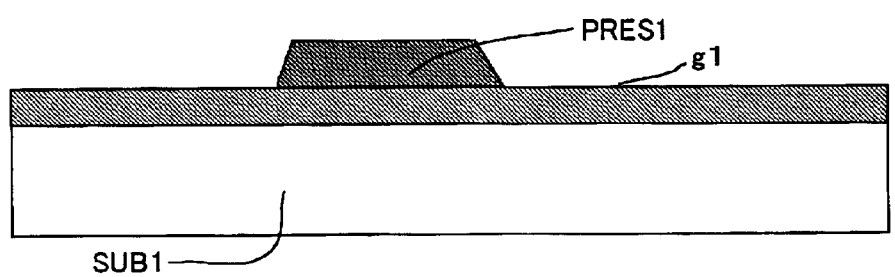
FIGS. 6A and 6B are cross-sectional views showing the first photo-process of a fabrication method for the TFT substrate according to Embodiment 1 of the invention in the order of time.
Figure 6B:
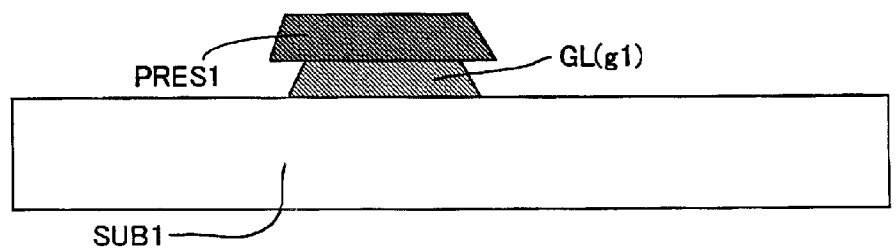

A first photo-process is shown in FIGS. 6A and 6B. A 200-nm-thick metal film g1, which is made of, for example, a single Cr or Mo film or a stacked film in which Al and Mo are stacked in this order or an alloy such as MoW, is deposited on a transparent insulating substrate SUB1 such as a glass substrate by using a sputtering method. Then, after a predetermined resist pattern PRES1 has been formed on this metal film g1, the metal film g1 is etched by using the predetermined resist pattern PRES1 as a mask. This patterned metal film g1 constitutes the gate wiring lines GL, the light shielding electrodes SKD and the lower electrodes of the gate terminals GTM in the pixel area shown in FIG. 1.

A second photo-process is shown in FIGS. 7A to 7D. A 350-nm-thick insulating film which is made of a SiN film or a two-layer film made of an SiN film and a SiO$_2$ film, a 250-nm-thick nondoped i-type a-Si film and a 50-nm-thick n$^+$-type a-Si film are deposited in that order over the entire surface of the TFT substrate SUB1 by using a plasma CVD method. The SiN film, the i-type a-Si film and the n$^+$-type a-Si film are respectively called the gate insulating film GI, the a-Si channel film AS and the a-Si contact film d0 in terms of TFT construction. However, although the gate insulating film GI is formed by the CVD method, the gate insulating film GI may also be formed as a multilayer structure by depositing a metal oxide such as $Ta_2O_5$ (tantalum oxide) by using a sputtering method before the CVD method. Subsequently, a 200-nm-thick metal film d1 such as a single Mo or Cr SiN film, a Mo/Al/Mo stacked film or an alloy film such as MoW is deposited by using the sputtering method. The deposition by the CVD method and the deposition by the sputtering method may also be continuously performed without breaking the vacuum. In this case, the connection resistance between the a-Si contact film d0 and the Mo metal film d1 which constitutes the source and drain electrodes is reduced and the capacity of TFTs is improved, whereby even if TFTs of the same plane size are used, it is possible to drive a larger-sized and higher-resolution liquid crystal display device. In addition, since the nontransparent TFT area which occupies the plane area of one pixel can be reduced, the aperture ratio is improved, whereby it is possible to provide a far brighter liquid crystal display device.

Figure 7A:
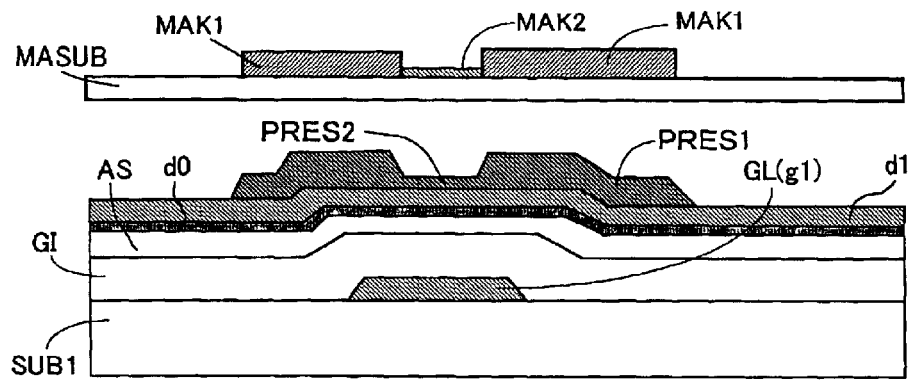
FIGS. 7A to 7D are cross-sectional views showing the second photo-process of the fabrication method for the TFT substrate according to Embodiment 1 of the invention in the order of time.
Figure 7B:
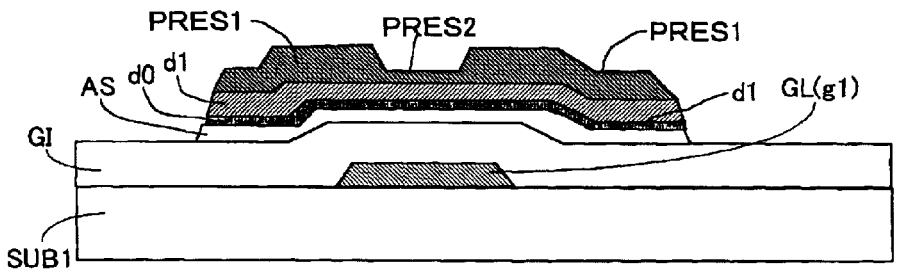

Then, a predetermined resist pattern (photo-resist pattern) is formed on this metal film d1. In FIG. 7A, the resist pattern PRES1 and a resist pattern PRES2 form resist pattern areas having different thicknesses through one exposure and development process. Such a resist pattern having a thick region and a thin region is obtained through so-called half-exposure process. The half-exposure process exposes a predetermined portion of a photo-resist layer so weakly that exposing depth of the predetermined region thereof does not to reach the thickness thereof and the predetermined portion thereof remains as the aforementioned thin region in contrast to the other region thereof being not exposed and remaining as the aforementioned thick region. The process of forming the resist patterns of different thicknesses through one exposure and development process reduces the number of fabrication processes for TFT substrates and realizes an improvement in yield factor. A method of fabricating such different resist patterns will be described below with reference to the photomask substrate MASUB shown in FIG. 7A. In the photo-process, the photomask is disposed over the TFT substrate SUB1 whose entire surface is coated with a resist, with a predetermined gap interposed between the photomask and the TFT substrate SUB1. The photomask has a structure having a nontransparent area (an opaque area) MAK1 made of Cr deposited to a predetermined thickness, an area MAK2 made of thinly deposited MoSi which can transmit light to a predetermined degree, and the other transparent area. In the case where a positive resist is used as the resist, the thickness of the resist after exposure and development becomes approximately close to the thickness of deposited film in the nontransparent area MAK1, and to a thickness 10–90% less than the thickness of film being deposited in the semitransparent area MAK2, and in the other transparent areas the resist is completely removed by cleaning. Accordingly, since the pattern of the photomask substrate MASUB is formed into three areas, i.e., nontransparent, semitransparent and transparent, the resist patterns PRES1 and PRES2 of different thicknesses can be realized on the TFT substrate SUB1 through one exposure and development process. In the next process et seq., the area of the resist pattern PRES1 forms the video signal lines DL for TFTs as well as the source and drain electrodes SD1 and SD2, while the area of the resist pattern PRES2 forms the channel length L areas of the TFTs.

The photomask fabrication method which forms resist patterns of different thicknesses on the TFT substrate SUB1 through one exposure and development process is not limited to the above-described method of forming the semitransparent metal area MAK2, but as disclosed in Japanese Patent Laid-Open No. 186233/1997, it is also possible to use a halftone mask in which the area MAK2 is made of a mesh-formed metal film having the same thickness as the area MAK1 so that the amount of exposure of the resist is reduced. However, as compared with the method of Embodiment 1, the method using such a halftone is low in the margin for adjustment of the amount of exposure reduction.

Then, as shown in the next cross-sectional view of the photo-process (FIG. 7B), the metal film d1, the a-Si contact film d0 and the a-Si channel film AS are etched by using a predetermined resist pattern on the metal film d1 as a mask. The etching is performed with dry etching in a vacuum apparatus, and if the metal film d1 is Mo, etching is performed with a gas in which $O_2$ is added to a $SF_6$ or $CC_{14}$ gas, or with this gas to which $Cl_2$ is further added, and the semiconductor films d0 and AS are etched with a gas in which HCl or $Cl_2$ is added to a gas containing at least $SF_6$ or $CF_4$ so that the etch selectivity of the semiconductor films d0 and AS is increased with respect to SiN which is the material of the gate insulating film GI. As described above, by dry-etching the metal film d1 for the source and drain electrodes SD1 and SD2 as well as the semiconductor films d0 and AS, the pattern accuracy of the video signal line DL formed by processing these films d1, d0 and AS can be made extremely high.

Figure 7C:
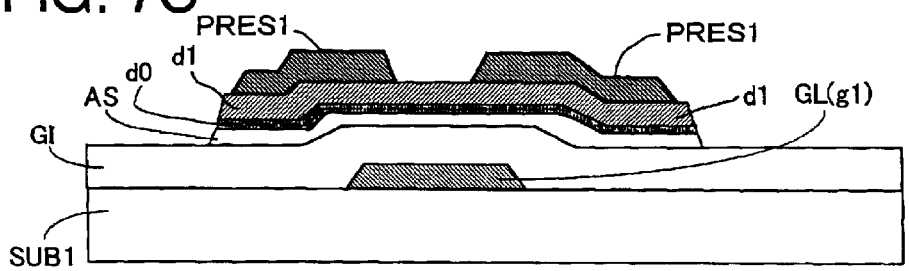
Figure 7D:
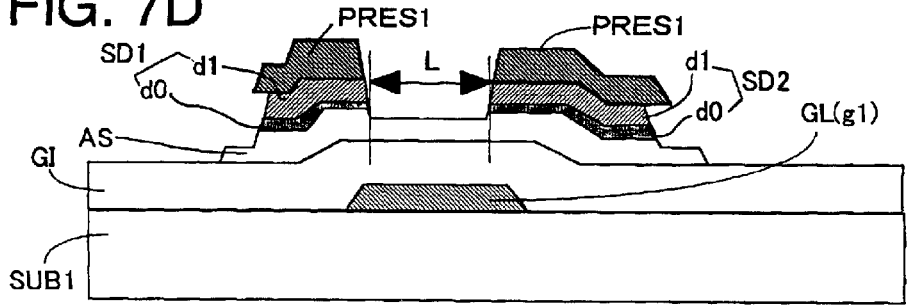
Figure 8A:
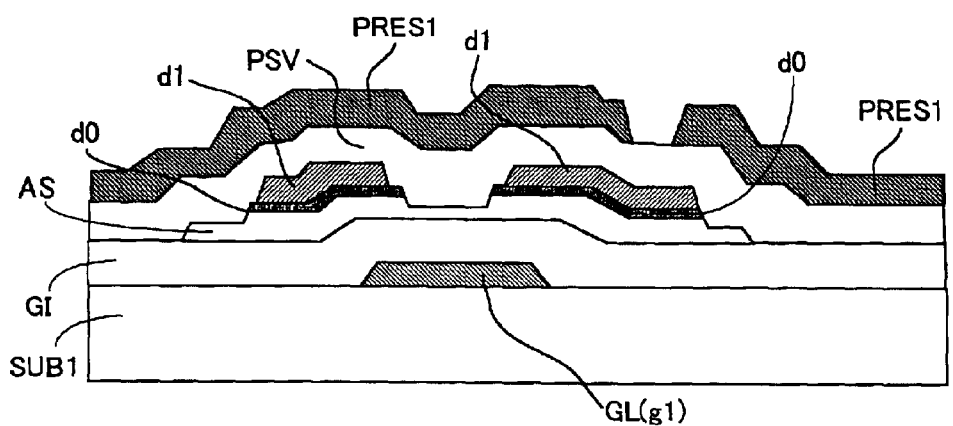
FIGS. 8A and 8B are cross-sectional views showing the third photo-process of the fabrication method for the TFT substrate according to Embodiment 1 of the invention in the order of time.
Figure 8B:
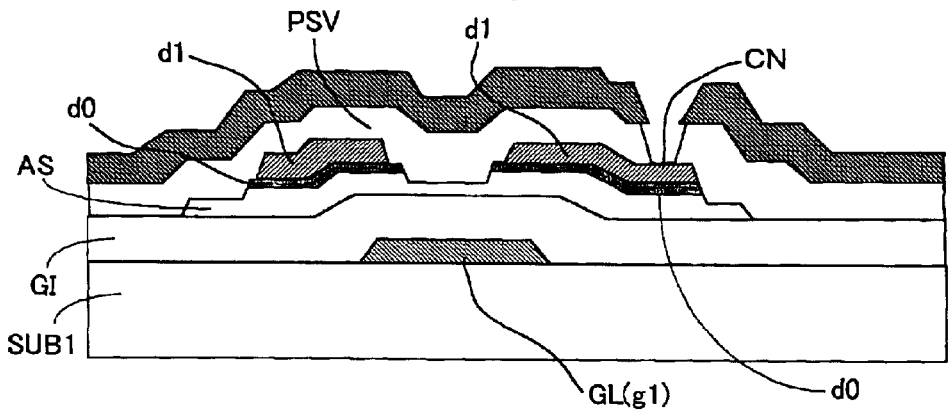

Then, as shown in FIG. 7C, dry ashing using an $O_2$ gas is used to remove a thin resist pattern which lies in the channel length L area of the TFT. During this time, although the thickness of the thick resist pattern PRES1 decreases, ashing conditions are adjusted so that the resist pattern PRES1 can be left as a photoresist pattern.

Then, the metal film d1 and the i-type a-Si channel film AS are half-etched so that a predetermined thickness is left, by using as a mask the resist pattern PRES1 which has been divided into sections corresponding to the source and drain electrode SD1 and SD2. In this process, the metal film d0 is removed by wet etching, and the etch selectivity of the a-Si contact layer d0 relative to SiN is increased by adjusting the amount of $Cl_2$ to be added to $SF_6$ or $CF_4$.

As described above, as compared with the prior art of performing the processing of an a-Si film and the processing of source and drain metals through two separate photo-processes, it is possible to integrate these processes into one process by using the semitransparent mask, whereby it is possible to realize a reduction in the number of required fabrication processes and hence an improvement in yield factor. In addition, since there is no need for photo-alignment of the a-Si film and the source and drain metal films, accuracy is improved and aperture ratio is also improved.

On the other hand, as compared with the prior art method, the metal films for the source and drain electrodes SD1 and SD2 as well as the drain wiring line DL are etched twice, and if the metal film d1 is wet-etched, the amount of undercutting due to side etching becomes large and pattern accuracy becomes low. On the other hand, dry etching features a high pattern accuracy, but in the second etching (channel length L portion) shown in FIG. 7D, if the wiring metals contain Mo, the same kind of etching gas as that for the the a-Si channel film AS at the lower portion is used and, in addition, processing is performed so that the thickness of the a-Si channel film AS is reduced to half. If the a-Si channel film AS is etched in batch, the margin of etching cannot be ensured and the channel length L area is removed up to the surface of the gate insulating film GI. In the case of Embodiment 1, if the metal film d1 contains Mo, the channel length portion of the metal film d1 is selectively wet-etched above the a-Si film d0 by using a mixture of phosphoric acid, nitric acid, acetic acid and water, and then, the a-Si film d0 is dry-etched, whereby the process is controlled so that the a-Si channel film AS is left. Consequently, it is found out that the method of subjecting the metal film d1 for the source and drain electrodes SD1 and SD2 to dry etching as the first etching and wet etching as the second etching within one photo-process realizes a processing method of good pattern accuracy.

Alternative photo-processes for the TFT substrate are shown in FIGS. 8A to 9B. A 400-nm-thick protective film PSV made of an SiN film is deposited on the entire surface of the TFT substrate SUB1 which has passed through the above-described process, by using a CVD method. Then, after a resist has been applied to the protective film PSV, a resist pattern PRES1 having an opening above the source electrode SD2 is formed by using a photo-method. Then, the contact hole CN is formed in the protective film PSV by using the resist pattern PRES1 as a mask. In this process, the gate terminal GTM and the drain terminal DTM shown in FIG. 1 are also processed, and as shown in FIG. 4, the laminated protective film PSV and the gate insulating film GI are opened at the gate terminal GTM in this process. The formation of this opening uses dry etching using a gas containing $SF_6$ or $CF_4$ or wet etching using a buffer solution of hydrofluoric acid.

Figure 9A:
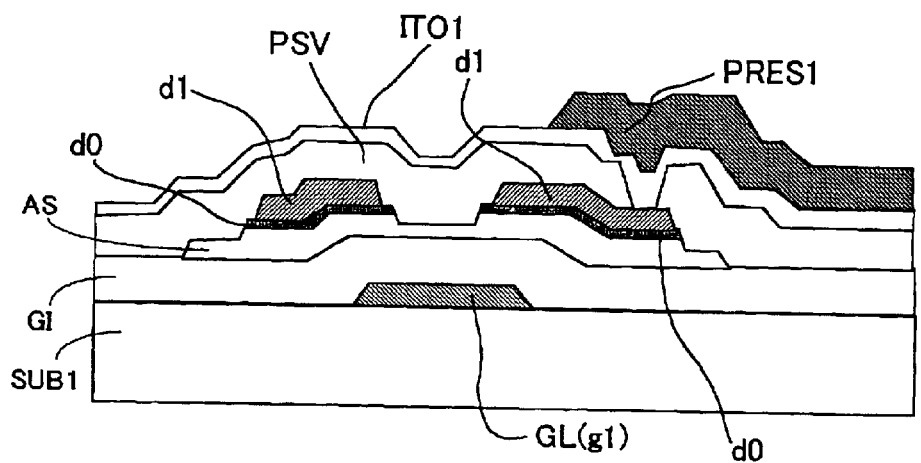
FIGS. 9A and 9B are cross-sectional views showing the fourth photo-process of the fabrication method for the TFT substrate according to Embodiment 1 of the invention in the order of time.
Figure 9B:
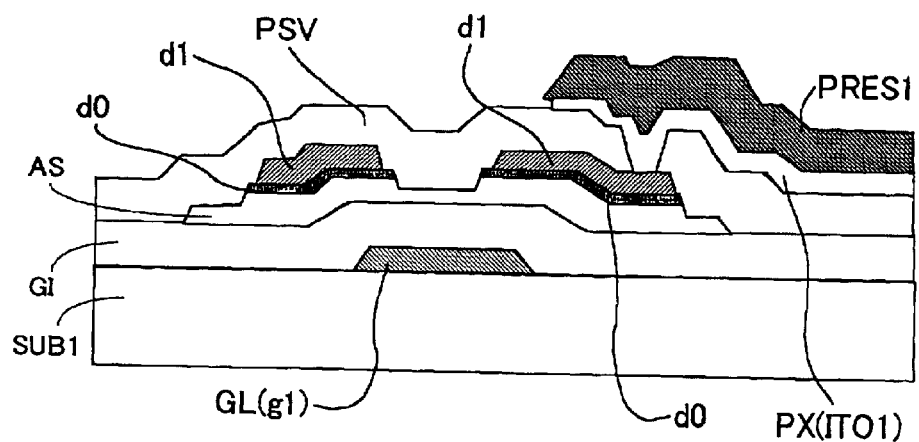

Then, as shown in FIGS. 9A and 9B, a 140-nm-thick transparent conductive film ITO1 made of ITO or IZO is deposited on the entire surface of the TFT substrate SUB1 by using a sputtering method. Then, after a resist pattern PRES1 is formed, this transparent conductive film ITO1 is processed by using the resist pattern PRES1 as a mask, thereby forming the pixel electrode PX. In addition, in this process, the upper film ITO1 of each of the terminal sections shown in FIGS. 1, 4 and 5 is formed.

In accordance with the above-described fabrication process of Embodiment 1, as compared with the prior art fabrication process, it is possible to reduce the number of required photo-processes including exposure and development from five to four, whereby it is possible to simplify the fabrication process and it is also possible to reduce defects due to dust or the like occurring in a process and improve the yield factor of the fabrication process. In addition, in terms of the TFT structure, the a-Si film and the signal lines are processed in one photo-process after having been continuously deposited, whereby the pattern accuracy of Embodiment 1 is improved compared to the conventional pattern accuracy with which a-Si films, signal lines and source and drain electrodes are separately processed through photo-alignment. Accordingly, it is possible to realize a bright liquid crystal display device having a high aperture ratio.

Embodiment 2

Figure 10:
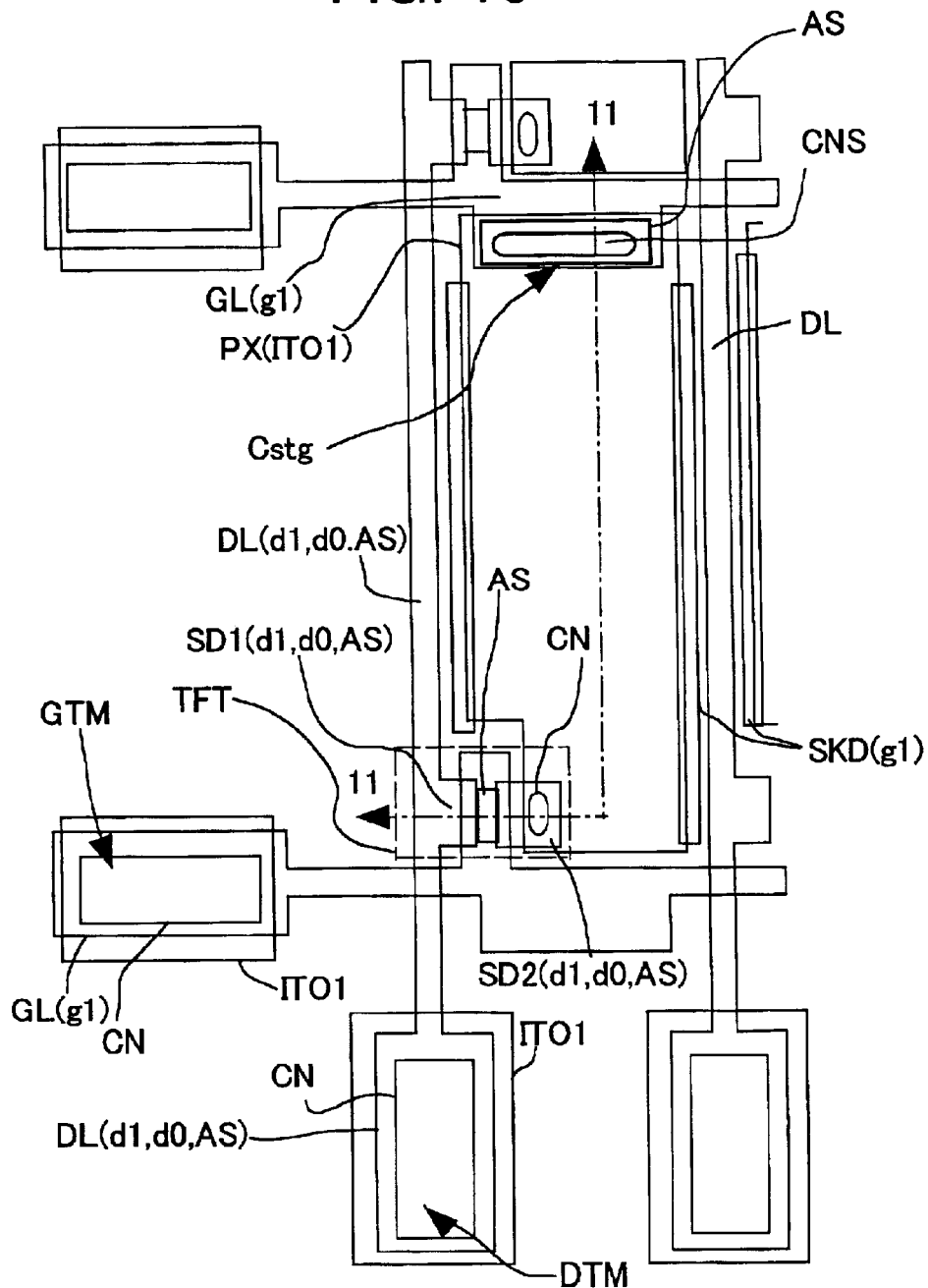
FIG. 10 is a plan view showing the TFT substrate of a liquid crystal display device according to Embodiment 2 of the invention.
Figure 11:
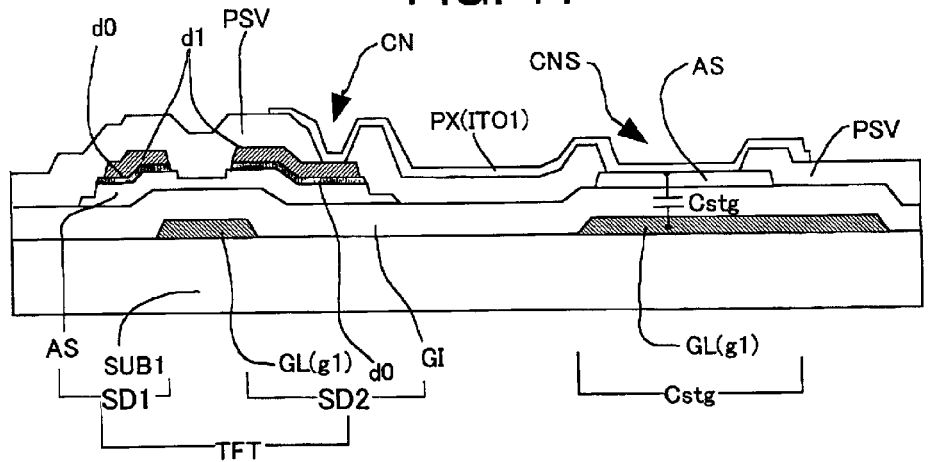
FIG. 11 is a cross-sectional view taken along line 11—11 of FIG. 10.

A reversed staggered type TFT liquid crystal display device according to the second embodiment of the invention will be described below with reference to FIGS. 10 to 13. FIG. 10 is a plan view showing one pixel in Embodiment 2 of the invention. FIG. 11 is a cross-sectional view taken along line 11—11 of FIG. 10. FIGS. 12A to 13B are cross-sectional views showing fabrication processes corresponding to the second and third photo-processes in the case of forming the cross-sectional structure of FIG. 11 through four photo-processes. The TFT liquid crystal display device according to Embodiment 2 and the first embodiment device shown in FIGS. 1 and 2 have constructions similar to each other with regard to their gate terminals, their drain terminals, their TFT sections and their signal line sections, but differ from each other in the construction of the charge-holding capacitance section Cstg. As shown in the cross-sectional view of FIG. 11, the TFT liquid crystal display device according to Embodiment 2 is similar to the liquid crystal display device according to Embodiment 1 in that the gate wiring line GL and the gate insulating film GI are formed on the TFT transparent insulating substrate SUB1, but the liquid crystal display device according to Embodiment 2 has a structure in which the a-Si channel film AS is partly formed on the gate insulating film GI and the transparent conductive film ITO1 formed of the same material as and in the same process as the pixel electrode PX is in contact with the a-Si channel film AS via a through-hole CNS formed in the protective film PSV overlying the a-Si channel film AS. Accordingly, the charge-holding capacitance Cstg has an upper electrode made of the transparent conductive film ITO1, a lower electrode made of the gate wiring line GL, and a dielectric film having a stacked film structure made of the gate insulating film GI and the i-type a-Si channel film AS. The plane pattern of this charge-holding capacitance Cstg is restricted by a fabrication method which will be described below, and as shown in FIG. 10, the contact hole CNS is located inside the i-type a-Si channel film AS.

The fabrication method for the cross-sectional structure shown in FIG. 11 will be described below with reference to FIGS. 12A to 13B. In the fabrication process of forming the cross-sectional structure by using four photo-processes, the first photo-process of patterning the gate wiring line GL and the fourth photo-process of patterning the pixel electrode PX by using the transparent conductive film ITO1 are approximately the same as the photo-processes of Embodiment 1 shown in FIGS. 6A and 6B and 9A and 9B, and the description of the first and fourth photo-processes is omitted.

Figure 12A:
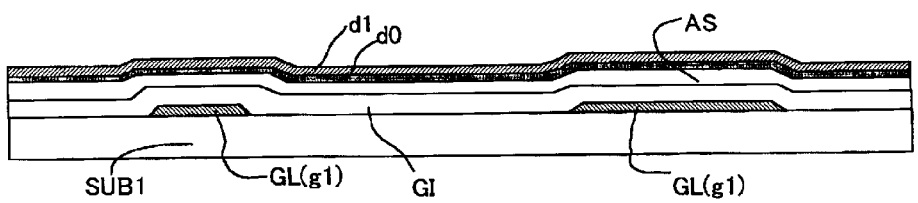
FIGS. 12A to 12C are cross-sectional views showing the successive steps of the second photo-process of a fabrication method for the TFT substrate according to Embodiment 2 of the invention.
Figure 12B:
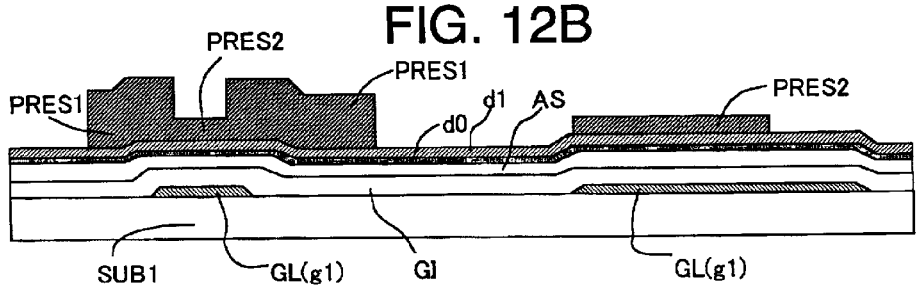
Figure 12C:
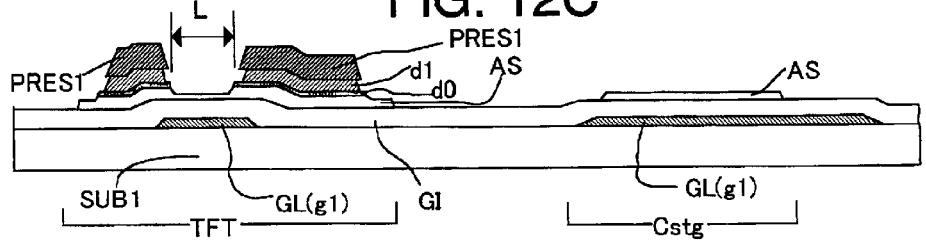

Cross-sectional views of the fabrication process of the second photo-process of Embodiment 2 are shown in FIGS. 12A to 12C. The gate wiring line GL is formed on the TFT glass substrate SUB1, and an SiN film which becomes the gate insulating film GI, an i-type a-Si film which becomes the a-Si channel film AS and an $n^+$-type a-Si film which becomes the a-Si contact film d0 are continuously deposited in this order on the TFT substrate SUB1 by a CVD method. Then, the metal film d1 for the source and drain electrodes SD1 and SD2 as well as the video signal line DL is deposited by a sputtering method without going through the photo-process (FIG. 12A).

Then, a photoresist is applied to the metal film d1, and is exposed and developed by using a photomask having a nontransparent area, a semitransparent area and a transparent area as shown in FIG. 7A of Embodiment 1, thereby forming a resist pattern PRES1 which is a thick portion corresponding to the nontransparent mask area and a resist pattern PRES2 which is a thin portion corresponding to the semitransparent mask area. In this process, Embodiment 2 differs from Embodiment 1 in that the thin resist pattern PRES2 corresponding to the semitransparent mask area is formed in a portion in which to form the charge-holding capacitance Cstg in the third and subsequent processes (FIG. 12B).

Then, processes similar to those shown in FIGS. 7A to 7D of Embodiment 1 are performed, i.e., the processing of the metal film d1 for the source and drain electrodes SD1 and SD2, the processing of the a-Si contact film d0 and the a-Si channel film AS, the removal of the thin resist pattern PRES2 by dry ashing, the wet etching of the metal film d1 in the channel length L portion, the dry etching of the a-Si contact film d0, and the half-etching of the a-Si channel film AS. In this manner, an area of half-etched a-Si channel film AS which does not contain the a-Si contact film d0 is formed in the area of the thin resist pattern PRES2 formed in the charge-holding capacitance Cstg section(FIG. 12C).

Figure 13A:
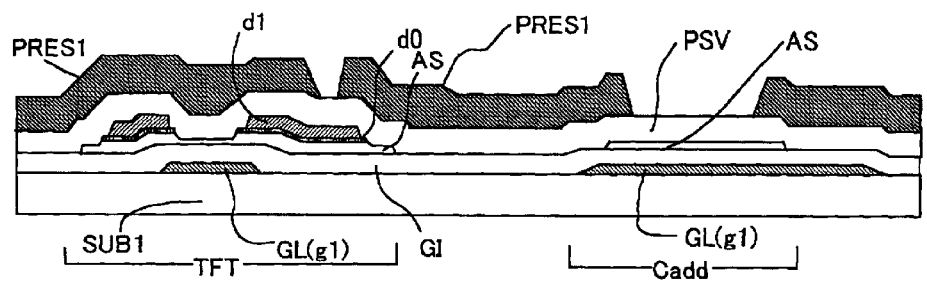
FIGS. 13A and 13B are cross-sectional views showing the successive steps of the third photo-process of the fabrication method for the TFT substrate according to Embodiment 2 of the invention.
Figure 13B:
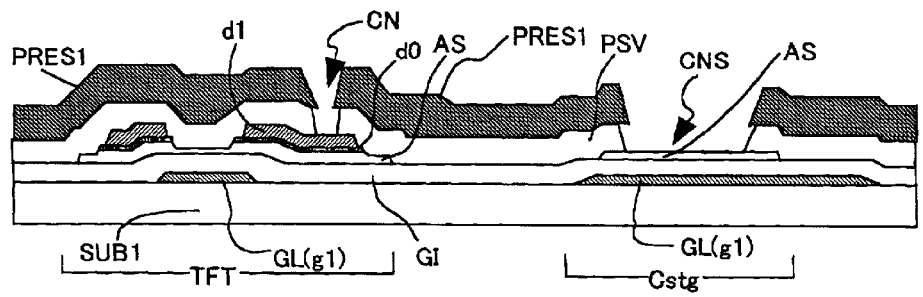

Then, after the protective film PSV made of SiN has been deposited by using a CVD method, the predetermined resist pattern PRES1 is patterned so as to correspond to an opening for the source electrode SD2 and an opening for the charge-holding capacitance Cstg (FIG. 13A). Then, by using a buffer solution of hydrofluoric acid, the protective film PSV is opened to form the contact hole CN above the source electrode SD2 and the through-hole CNS in the charge-holding capacitance Cstg section. In Embodiment 2, dry etching with $SF_6$ or $CF_4$ cannot be used for the processing of the through-holes CN and CNS. This is because the etching speed of the gas for the a-Si channel film AS is fast similarly to that for SiN which forms the protective film PSV, so that the gas etches the gate insulating film GI on the gate wiring line GL. With the buffer solution of hydrofluoric acid, it is possible to effect approximately 100% selective etching of a-Si and SiN. The through-holes are formed in the stacked film of the gate insulating film GI and the protective film PSV of the gate terminal GTM by etching with this buffer solution of hydrofluoric acid.

The subsequent process deposits the transparent conductive film ITO1 and patterns the pixel electrode PX in a manner similar to that shown in FIGS. 9A and 9B.

The charge-holding capacitance Cstg of Embodiment 2 has a laminated structure consisting of an upper electrode made of the transparent conductive film ITO1 which is formed in the same process and of the same material as the pixel electrode PX and a lower electrode which is the gate wiring line GL, as in Embodiment 1. However, unlike the charge-holding capacitance Cstg of Embodiment 1, the charge-holding capacitance Cstg of Embodiment 2 has a dielectric film having a stacked structure made of the SiN gate insulating film GI and the half-etched a-Si channel film AS. In the structure of the charge-holding capacitance Cstg of Embodiment 2, the dielectric film is thin in thickness compared to the dielectric film of Embodiment 1 having a stacked structure made of the SiN gate wiring line GL and the SiN protective film. Moreover, the dielectric constant of the a-Si film is 12 which is greater than 7 of the SiN film, whereby Embodiment 2 makes it possible to form a larger charge-holding capacitance Cstg in a smaller area than does Embodiment 1. Accordingly, since the width of the gate wiring line GL can be made narrower in Embodiment 2 shown in FIG. 10 than in Embodiment 1 shown in FIG. 1, the aperture ratio can be increased, whereby it is possible to realize a bright liquid crystal display device.

A structure which uses an a-Si film in a charge-holding capacitance section is disclosed in Japanese Patent Laid-Open No. 202153/1994. The disclosed structure includes a gate insulating film formed over lower wiring, an i-type a-Si film and an $n^+$-type a-Si film formed over the gate insulating film, source and drain electrode metals formed over the i-type a-Si film and the $n^+$-type a-Si film, and a protective film overlying the electrode metals, and the protective film is opened above the electrode metals so that the electrode metals are connected to a transparent conductive film. The present inventor fabricated this structure and obtained the following result. During charging of a TFT, electrons were supplied to the i-type a-Si film from the transparent conductive film via both a metal electrode formed in the same process as the source and drain electrodes and an $n^+$-type a-Si film, whereby the i-type a-Si film became a conductor and the charge-holding capacitance value became large. Contrarily, during the charge-holding period in which the TFT was off, the i-type a-Si film worked as a dielectric and emitted electrons, with the result that during the charge-holding period the pixel potential lowered and caused a display defect such as image retention. This image retention effect became larger as the i-type a-Si film became thicker.

As compared with the above-described prior art, in Embodiment 2, the image retention is reduced owing to the following advantages, whereby it is possible to realize a good display device. One of the advantages is that the a-Si channel film AS of the charge-holding capacitance Cstg shown in FIG. 11 is thinned by half-etching after deposition, and the second one is that in the structure of Embodiment 2 the a-Si contact film d0 is removed and the efficiency of injection of electrons into the a-Si channel film AS from the transparent conductive film ITO1 of the pixel electrode PX is extremely small (the contact resistance is large). Accordingly, in the structure of Embodiment 2, the a-Si channel film AS purely works as a dielectric, whereby it is possible to realize a good liquid crystal display device in which no image retention occurs.

Embodiment 3

Figure 14:
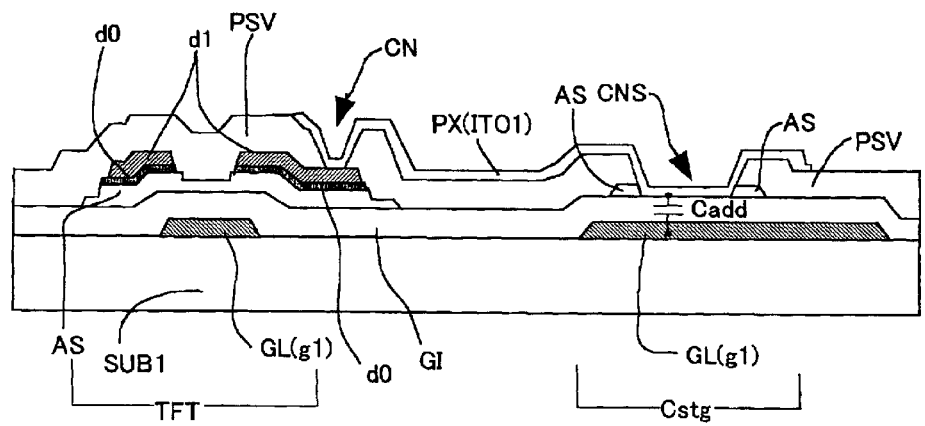
FIG. 14 is a cross-sectional view showing a TFT section, a pixel electrode section and a charge holding capacitor section in one pixel of a TFT substrate according to Embodiment 3 of the invention.
Figure 15A:
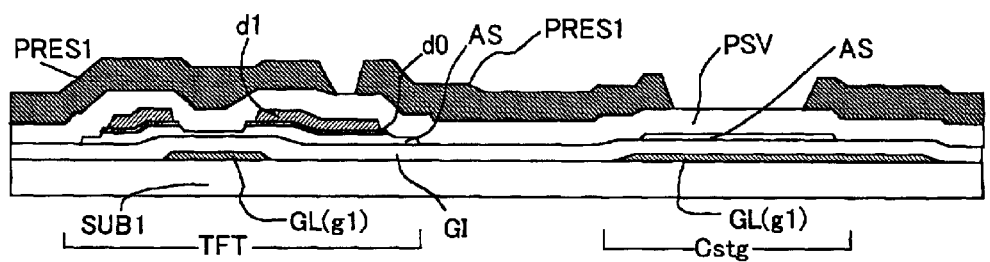
FIGS. 15A to 15C are cross-sectional views showing the successive steps of the third photo-process of a fabrication method for the TFT substrate according to Embodiment 3 of the invention.
Figure 15B:
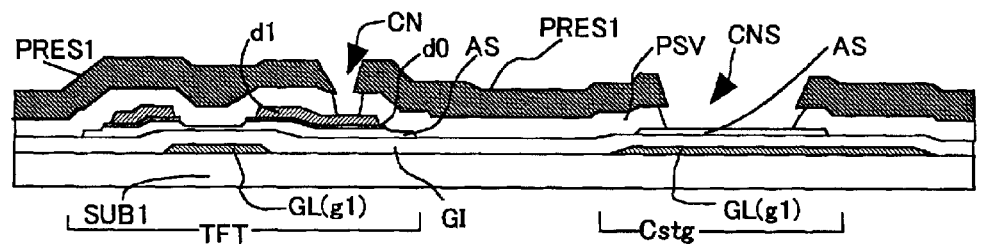
Figure 15C:
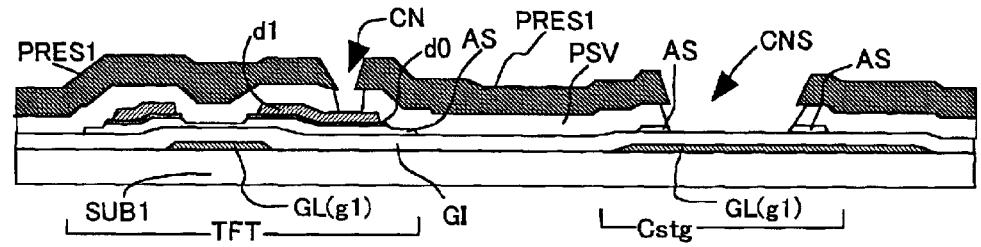

A reversed staggered type TFT liquid crystal display device according to the third embodiment of the invention will be described below with reference to FIGS. 14 to 15C. FIG. 14 is a cross-sectional view showing a portion which extends from a TFT corresponding to one pixel to the charge-holding capacitance Cstg through the transparent electrode ITO1 in Embodiment 3. FIGS. 15A to 15C are cross-sectional views showing fabrication processes corresponding to the third photo-process in the case of forming the cross-sectional structure of FIG. 14 through four photo-processes. The TFT liquid crystal display device according to Embodiment 3 and the second embodiment device shown in FIGS. 10 and 11 have constructions similar to each other with regard to their gate terminals, their drain terminals, their TFT sections and their signal line sections, but differ from each other in the construction of the section of the charge-holding capacitance Cstg. The plane pattern of one pixel is approximately the same as that of Embodiment 2 shown in FIG. 10, and the illustration of the plane pattern is omitted.

As shown in the cross-sectional view of FIG. 14, Embodiment 3 is the same as Embodiment 2 shown in FIG. 11 in that in the section of the charge-holding capacitance Cstg, the gate wiring line GL and the gate insulating film GI are formed on the TFT transparent insulating substrate SUB1 and the a-Si channel film AS is partly formed on the gate insulating film GI. However, Embodiment 3 has a structure in which the pixel electrode PX made of the transparent conductive film ITO1 is directly connected to the gate insulating film GI via the through-hole CNS opened in the protective film PSV. The a-Si channel film AS has a structure such that it is in contact with side surfaces of the pixel electrode PX. Although the illustration of the plane structure of the section of the charge-holding capacitance Cstg is omitted, the a-Si channel film AS is removed from only the section of the through-hole CNS to the charge-holding capacitance Cstg inside the island-shaped pattern of the a-Si channel film AS.

Cross-sectional views of the fabrication process of the third photo-process of Embodiment 3 are shown in FIGS.

15A to 15C. The gate wiring line GL is formed on the TFT glass substrate SUB1, and an SiN film which becomes the gate insulating film GI, an i-type a-Si film which becomes the a-Si channel film AS and an n$^+$-type a-Si film which becomes the a-Si contact film d0 are continuously deposited in this order on the TFT substrate SUB1 by a CVD method. Then, the metal film d1 for the source and drain electrodes SD1 and SD2 as well as the drain wiring line DL is deposited by a sputtering method without passing through the photo-process. Then, the source and drain electrodes SD1 and SD2 are processed by a halftone exposure and development method, and a half-etched island-shaped a-Si channel film AS is formed in the section of the charge-holding capacitance Cstg section. Moreover, photo processing is done up to the TFT substrate SUB1 coated with the SiN protective film PSV by a CVD method, whereby processes are completed. A photoresist which corresponds to the opening CN in the source electrode SD2 of the TFT section and which corresponds to the opening hole CNS in the section of the charge-holding capacitance Cstg is applied to the TFT substrate SUB1, and the resist pattern PRES1 is formed.

Then, by using a buffer solution of hydrofluoric acid, the protective film PSV is opened to form the through-hole CN above the source electrode SD2 and the through-hole CNS in the section of the charge-holding capacitance Cstg. In Embodiment 3, in this process, drying etching with SF$_6$ or CF$_4$ cannot be used for the processing of the through-holes CN and CNS. This is because the etching speed of the gas for the a-Si channel film AS is as fast as that for SiN which forms the protective film PSV, so that the gas also etches the gate insulating film GI on the gate wiring line GL. With the buffer solution of hydrofluoric acid, it is possible to effect approximately 100% selective etching of a-Si and SiN. In addition, if the surface of the metal electrode d1 of the source electrode SD2 that is in contact with the protective film PSV is made of Mo, Cr or an alloy of Mo and Cr, the buffer solution of hydrofluoric acid does not etch (FIG. 15B).

Then, the a-Si channel film AS over the charge-holding capacitance Cstg is selectively etched above the gate insulating film GI formed of SiN at the opening CNS with the resist pattern PRES1 being left. The etching is performed with a so-called chlorine type gas in which Cl$_2$ or HCl is added to SF$_6$ or CF$_4$. If the outermost surface of the metal film d1 of the source electrode SD2 is made of Cr or a metal containing Cr, the a-Si channel film AS is not removed by the dry etching using the chlorine gas. If the outermost surface is made of Mo or a metal which mainly contains Mo, the speed of the drying etching for the processing of the through-holes is slower than that for the a-Si channel film AS in the section of the charge-holding capacitance Cstg. Accordingly, the metal film d1 of the source electrode SD2 is not completely removed when the etching of the a-Si channel film AS is completed, whereby it is possible to achieve the good contact characteristics between the source electrode SD2 and the transparent conductive film ITO1. The favorable effect of the above-described etching is also achieved due to the fact that the a-Si channel film AS of the charge-holding capacitance Cstg shown in FIG. 15A is etched to a thickness smaller than that of the a-Si channel film AS of the TFT section, i.e., the thickness of the a-Si channel film AS during deposition. Although the fabrication method of Embodiment 3 has been described in detail, the i-type a-Si film and the metal film d1 of the source electrode SD2 are respectively deposited to thicknesses of approximately 250 nm and approximately 200 nm by the CVD method, but the a-Si channel film AS to be actually etched through the opening CNS of the charge-holding capacitance Cstg in the step of FIG. 15C is already half-etched from 250 nm thick to 100 to 150 nm thick or less. Accordingly, even when this film AS is selectively etched, the metal film d1 of the electrode SD is not etched even if Mo or an alloy containing Mo is used as the metal film d1.

On the other hand, the a-Si channel film AS underlying the protective film PSV is etched near the outline of the opening CNS of the charge-holding capacitance Cstg, and if the a-Si channel film AS is thick, the a-Si channel film AS is side-etched into the protective film PSV, so that the transparent conductive film ITO1 to be deposited in a later process may be disconnected. In the structure and the fabrication method according to Embodiment 3, the a-Si channel film AS is thinned by half-etching, and regarding the deposition temperature of SiN in the CVD method that of the protective film PSV is set to be lower than that of the gate insulating film GI so that the etching speed of the protective film PSV is set to be larger than that of the gate insulating film GI during the same dry etching. Accordingly, the etched end surfaces of the protective film PSV and the a-Si channel film AS at the through-hole CNS of the charge-holding capacitance Cstg of the pixel electrode PX have good shapes, whereby the transparent conductive film ITO1 of the pixel electrode PX is not disconnected.

In Embodiment 3, owing to the above-described advantages, the above-described image retention is reduced, whereby it is possible to realize a bright display device having a large aperture ratio. The charge-holding capacitance Cstg has an upper electrode made of the transparent conductive film ITO1, a lower electrode made of the gate wiring line GL, and a dielectric film is made of parallel capacitances in the area formed of three films, i.e., the gate insulating film GI, the a-Si channel film AS and the protective film PSV, in and near the area of the contact hole CNS used as the gate insulating film GI. In particular, since the section of the contact hole CNS is composed of only the gate insulating film GI, the capacitance per unit area can be made large compared to Embodiments 1 and 2, so that the width of the underlying gate wiring line GL can be made small and the aperture ratio can be increased, whereby it is possible to realize a bright liquid crystal display device. In Embodiment 3, the efficiency of injection of electrons into the a-Si channel film AS from the pixel electrode PX is small compared to Embodiment 2, whereby the liquid crystal display device is improved in performance for reducing image retention. In addition, it is possible to provide a fabrication method in which even if the protective film PSV and the gate insulating film GI are made of the same kind of material such as SiN film, even if the protective film PSV overlying the gate insulating film GI is removed, the gate insulating film GI only can be selectively left.

Embodiment 4

Figure 16:
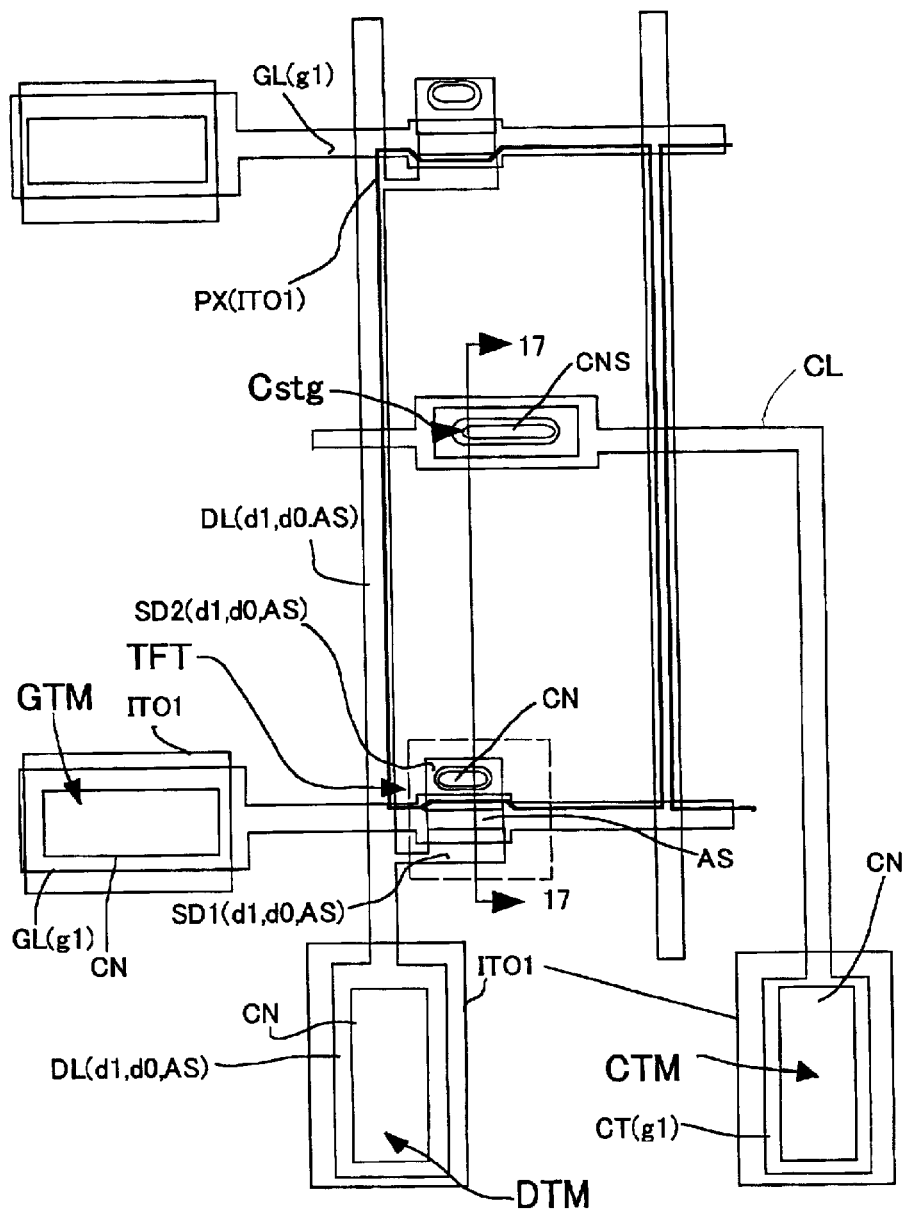
FIG. 16 is a plan view showing the TFT substrate according to Embodiment 4 of the invention.
Figure 17:
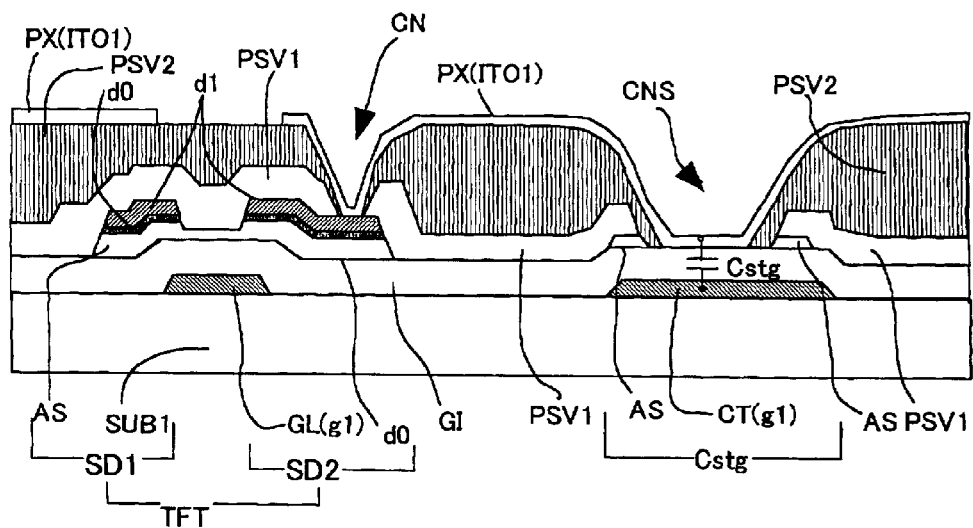
FIG. 17 is a cross-sectional view taken along line 17—17 of FIG. 16.
Figure 18A:
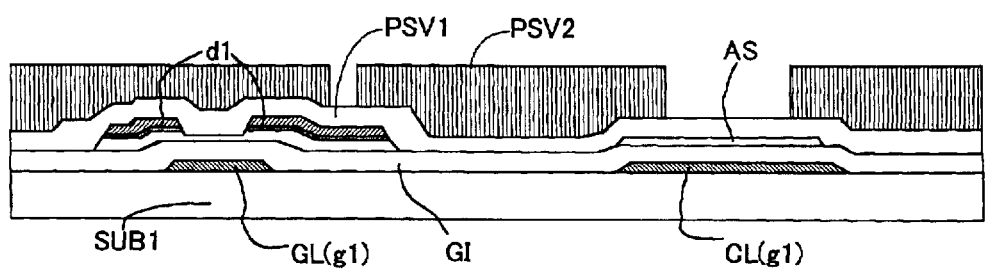
FIGS. 18A to 18C are cross-sectional views showing successive steps of the third photo-process of a fabrication method for the TFT substrate according to Embodiment 4 of the invention.
Figure 18B:
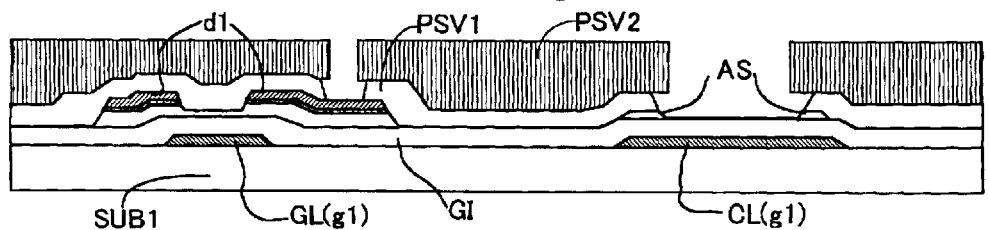
Figure 18C:
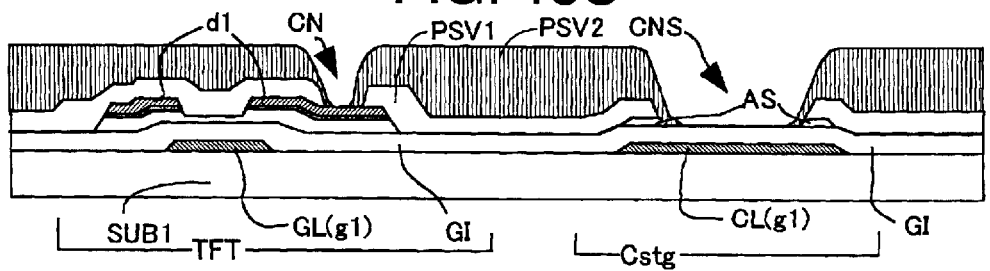

A TFT liquid crystal display device according to the fourth embodiment of the invention will be described below with reference to FIGS. 16 to 18C. FIG. 16 is a cross-sectional view showing a portion which corresponding to one pixel in Embodiment 4. FIG. 17 is a cross-sectional view taken along line 17—17 of FIG. 16. FIGS. 18A to 18C are cross-sectional views showing fabrication processes corresponding to the third photo-process in the case of forming the cross-sectional structure of FIG. 17 through four photo-processes. The TFT liquid crystal display device according to Embodiment 4 differs in structure from the above-described other embodiments in the following respects.

The plane structure of the one pixel shown in FIG. 16 differs from that shown in FIG. 1 of Embodiment 1 and that shown in FIG. 10 of Embodiment 2 in the following two respects. In the first place, the charge-holding capacitance Cstg is independent of the gate wiring line GL, and is formed on a charge-holding capacitance line CL formed in the same process as and of the same material g1 as the gate wiring line GL. In the second place, the pixel electrode PX made of the transparent conductive film ITO1 is disposed to overlap the signal line DL so that the signal line DL is used as a light-shielding electrode to improve the aperture ratio.

A structure peculiar to the invention for realizing the above-described high aperture ratio is shown in FIG. 17 in cross section. FIG. 17 is a cross-sectional view showing a portion which extends from the TFT section through the pixel electrode PX to the charge-holding capacitance line CL which forms the charge-holding capacitance Cstg. One major feature of the shown structure is that a protective film underlying the pixel electrode PX made of the transparent conductive film ITO1 has a stacked structure formed of the first protective film PSV1 made of an SiN film (as shown in Embodiment 1) and a second protective film PSV2 made of an organic film. Another major feature of the shown structure is that the pixel electrode PX made of the transparent conductive film ITO1 overlying the charge-holding capacitance Cstg is in contact with the gate insulating film GI through the through-hole CNS formed between the second protective film PSV2 and the first protective film PSV1, whereby the value of the charge-holding capacitance Cstg per unit area is improved.

Here will be given the reasons that the above-described structure of the charge-holding capacitance Cstg and the organic second protective film PSV2 introduced in Embodiment 3 realize a so-called liquid crystal display device having a high aperture ratio. The second protective film PSV2 shown in FIG. 17 uses, for example, an acrylic resin film of thickness 2 $\mu$m. This thickness is set to be ten times as large as 200–400 nm which is the thickness of the first SiN protective film PSV1 used in Embodiment 1 or 2. The dielectric constant of the second protective film PSV2 is approximately 3, compared to 7 for SiN. For these reasons, even if the pixel electrode PX is disposed to overlap the signal line DL with the first and second protective film PSV1 and PSV2 being interposed therebetween in the plane structure of the pixel shown in FIG. 16, the parasitic capacitance between the signal line DL and the pixel electrode PX is small, and voltage fluctuation noise due to the parasitic capacitance is small and crosstalk due to this voltage fluctuation noise does not occur. In the case where the protective film which realizes the above-described low capacitance is used, if the structure of the charge-holding capacitance Cstg of Embodiment 1 is used, the capacitance value per unit area of a dielectric which constitutes the charge-holding capacitance Cstg becomes extremely small owing to a three-film structure made of the gate insulating film GI, the first protective film PSV1 and the second protective film PSV2, so that the width of the charge-holding capacitance line CL needs to be widened to ensure the data retentivity of liquid crystal and the width of the nontransparent area made of the metal film g1 becomes large to lower the aperture ratio. However, in Embodiment 3, the dielectric film of the charge-holding capacitance Cstg is largely made of the gate insulating film GI and the capacitance value per unit area can be made large, whereby it is possible to realize a bright liquid crystal display device having charge-holding capacitance lines of narrow width and hence a high aperture ratio.

On the other hand, a prior art in which an organic film is used as a protective film and a charge-holding capacitance line is disposed in each pixel including a TFT and a gate insulating film is used as a charge-holding dielectric is disclosed in Japanese Patent Laid-Open No. 90404/1997. In this prior art, the source electrode of the TFT is formed to be extended onto the charge-holding capacitance line, and this source electrode is connected to a pixel electrode through an opening formed in the organic protective film. This method improves the capacitance value per unit area, but separately processes the source electrode and an a-Si semiconductor film through different photo-processes, and therefore, needs at least five or more photo-processes for processing a TFT substrate. As a result, with the prior art method, it is impossible to achieve another object of the invention which is to reduce the number of photo-processes to four or less and improve yield factor to reduce cost.

A fabrication method according to Embodiment 4 is shown in FIGS. 18A to 18C. The cross-sectional views of. FIGS. 18A to 18C correspond to the third photo-process in the case of forming the cross-sectional structure of FIG. 17 through four photo-processes. The first, second and fourth photo-processes of Embodiment 4 are approximately the same as those of Embodiment 2, and the illustration of these photo-processes is omitted. In the following description, it is assumed that the TFT substrate SUB1 has already passed through the first and second photo-processes. On the TFT substrate SUB1, the half-etched a-Si channel film AS is patterned in an island-like shape on the gate insulating film GI of the charge-holding capacitance line CL and the first protective film PSV1 using an SiN film is deposited on the a-Si channel film AS.

Then, for example, an acrylic photosensitive resin is formed as the second protective film PSV2 by a spin coating method. Moreover, this resin is exposed and developed into a pattern which has an opening for the source electrode SD2 of the TFT and an opening for the charge-holding capacitance Cstg (FIG. 18A). This photosensitive resin, therefore, serves the role of a photoresist for patterning and the second protective film PSV2. By using the second protective film PSV2 as a mask, the first protective film PSV1 of SiN (including the gate insulating film GI at the gate terminal section) is selectively etched above the a-Si channel film AS of the charge-holding capacitance Cstg by using a buffer solution of hydrofluoric acid in a manner similar to that described in connection with Embodiment 3. Subsequently, the a-Si channel film AS is selectively etched above the underlying SiN gate insulating film GI by a gas in which a chlorine gas such as HCl or $Cl_2$ is added to $CF_4$ or $SF_6$ (FIG. 18C).

Then, the TFT substrate SUB1 is heated at 200° C. By this heating, the corner portions of the cross-sectional structure are rounded, and further, the second protective film PSV2 is extended into each of the openings CN and CNS (FIG. 18C). Owing to this heating process, i.e., reflow processing, the stepped shape of the second protective film PSV2 as thick as 2–3 $\mu$m becomes gentle, whereby it is possible to prevent disconnection of the transparent conductive film ITO1 in the fourth photo-process.

As described above, the structure of the charge-holding capacitor Cstg of Embodiment 4 is such that in the essential section of the charge-holding capacitor Cstg, an upper electrode is the pixel electrode PX made of the transparent conductive film ITO1 formed to be extended from the organic protective film PSV2 into the through-hole CNS formed in the first protective film PSV1 made of an SiN film and the organic protective film PSV2, and a lower electrode is made of the metal film g1 of the charge-holding capacitance line CL formed in the same process as and of the same material as the gate wiring line GL. The gate insulating film GI is used as a dielectric, and another dielectric is a laminated film made of the gate insulating film GI, the a-Si channel film AS, the first protective film PSVL and the second protective film PSV2. This construction is fabricated with good yield factor through four photo-processes.

In the case where the opening CNS in the protective films PSV1 and PSV2 of the a-Si channel film AS of the section of the charge-holding capacitor Cstg is etched with a mask, this etching may be performed after the above-described heat treatment process of the organic material.

Embodiment 5

Figure 19:
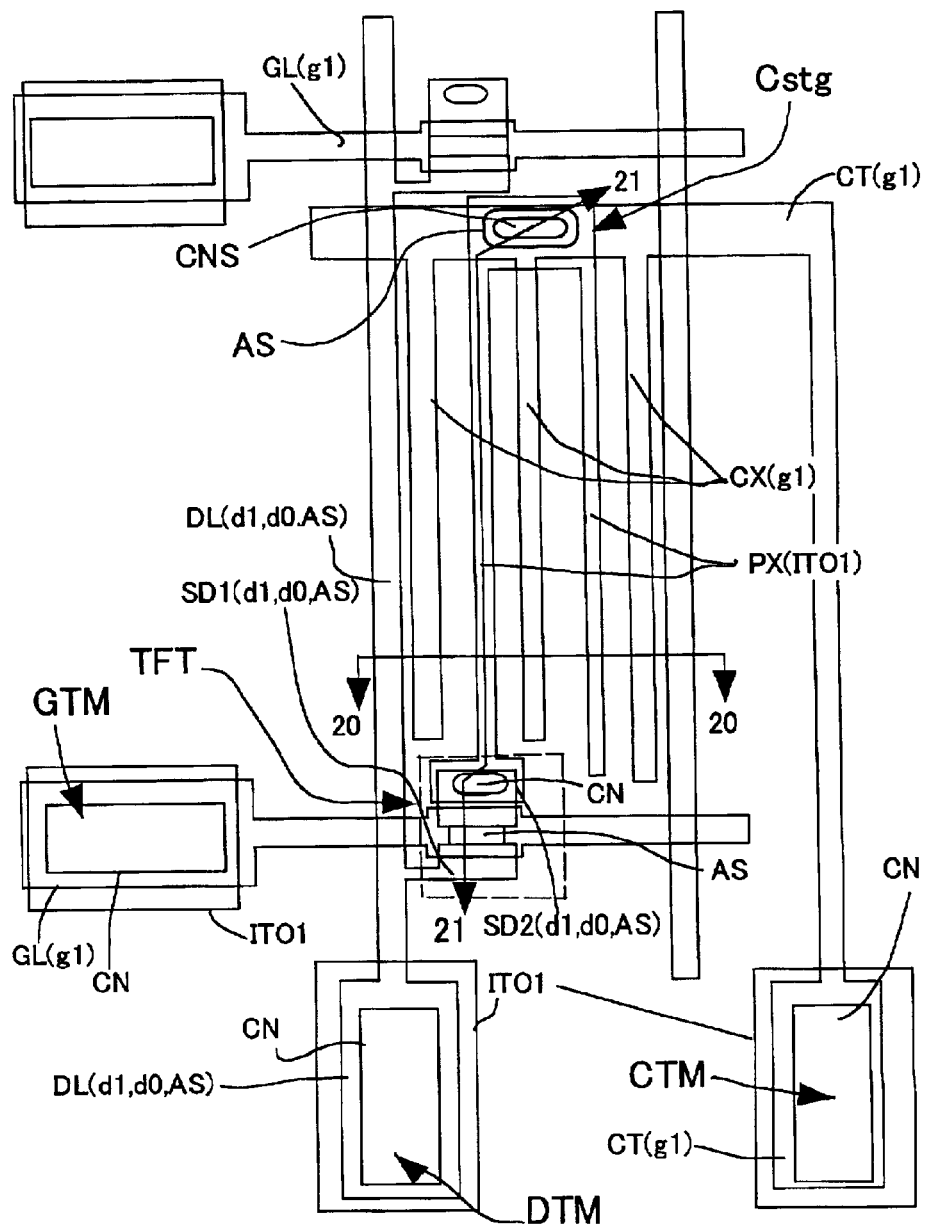
FIG. 19 is a plan view of a TFT substrate in an IPS type liquid crystal display device according to Embodiment 5 of the invention.
Figure 20:
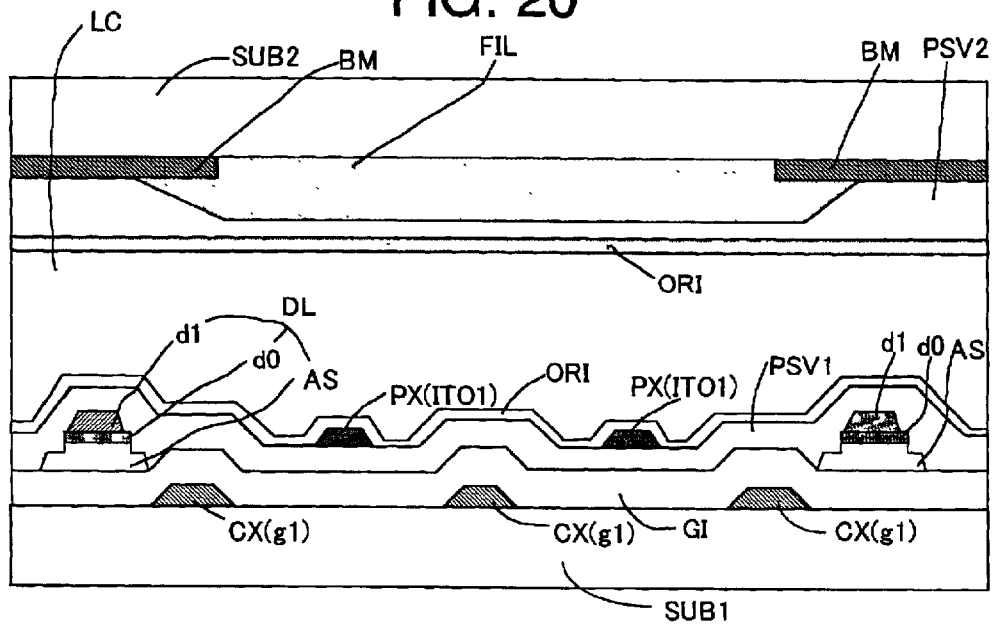
FIG. 20 is a cross-sectional view taken along line 20—20 of FIG. 19, showing a pixel area interposed between drain wiring lines in the liquid crystal display device according to Embodiment 5 of the invention.
Figure 21:
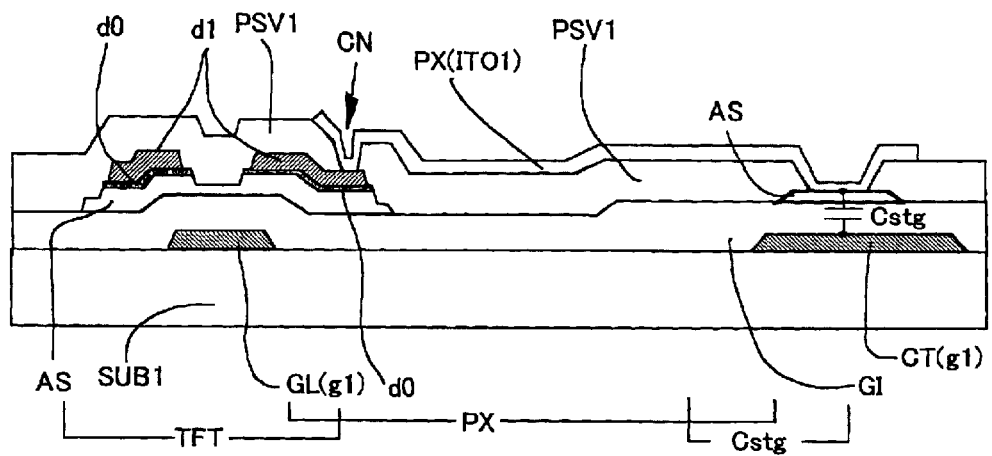
FIG. 21 is a cross-sectional view taken along line 21—21 of FIG. 19.

Embodiment 5 of the invention is shown in FIGS. 19 to 21. FIG. 19 shows the planar pattern of one pixel, and FIG. 20 is a cross-sectional view taken along line 20—20 of FIG. 19 and FIG. 21 is a cross-sectional view taken along line 21—21 of FIG. 19. Embodiment 5 of the invention relates to an in-plane-switching (IPS) display mode of pixel structure for realizing wide viewing angle characteristics.

The layout of one pixel is such that, as shown in FIG. 19, the pixel electrode PX and the counter (common) electrode CT are disposed in a comb-teeth shape. Accordingly, the display control of the pixel is performed by a lateral electric field which is applied to the liquid crystal LC from the pixel electrode PX toward the common electrode CT, as shown in the cross-sectional view of FIG. 20. Light to be transmitted through the spaces between the comb-teeth like electrodes is controlled by this electric field.

Similarly to the planar construction of one pixel of a display mode having common electrodes on the color filter substrate SUB2 used in each of Embodiments 1 to 4, in the planar construction of one pixel of Embodiment 5, a TFT is provided with the gate wiring line GL and the drain wiring line DL which perpendicularly intersect each other, and the pixel electrode PX is connected to the source electrode SD2 of the TFT via the through-hole formed in the protective film and is formed of the transparent conductive film ITO1. Similarly to the charge-holding capacitance line of Embodiment 4, this common electrode wiring line CT is independent of the gate wiring line Gl and is formed in the same process as and of the same material as the gate wiring line GL, and is branched off in a comb-teeth shape in the pixel and forms common electrodes CX disposed to be opposite to the pixel electrodes PX. Similarly to the charge-holding capacitance line CL of Embodiment 4, the counter electrode wiring line CT also works as a circuit wire which constitutes a charge holding capacitor, and constitutes the charge-holding capacitor Cstg which uses the transparent conductive film of the pixel electrode PX as its upper electrode.

FIG. 20 is a cross-sectional view showing the drain wiring line DL, the comb-teeth-like pixel electrode PX and the comb-teeth-like common electrode CX. The drain wiring line DL has a staircase-like cross-sectional shape in which the a-Si channel film AS, the a-Si contact film d0 and the metal film d1 such as Mo or Cr are laminated in this order on the gate insulating film GI. In particular, the a-Si channel film AS formed of an i-type a-Si film is wider than the metal film d1 of the drain wiring line DL, and serves as a dielectric and has the advantage of reducing the wiring line load capacitance between the drain wiring line DL and the common electrode CX. Accordingly, it is possible to realize a large-sized and high-resolution TFT liquid crystal display device. Moreover, the a-Si channel film AS, the a-Si contact film d0 and the metal film d1 which form the staircase-like cross-sectional shape are continuously deposited by a CVD method and a sputtering method and are processed through one photo-process, as in the case of the fabrication method of Embodiment 1. As compared with the case where the a-Si channel film AS and the a-Si contact film d0 are separately processed through two photo-processes in a manner performed in the related art fabrication method, there occurs no influence of the deviation of photo-alignment between the a-Si channel film AS and the metal film d1, and micromachining is enabled with load capacitance decreased. As a result, it is possible to realize a bright liquid crystal display device having a high aperture ratio.

FIG. 21 is a cross-sectional view of a portion which extends from the TFT through the pixel electrode PX to the section of the charge-holding capacitor Cstg of the common electrode wiring line CT. The basic cross-sectional structure shown in FIG. 21 is similar to that shown in FIG. 11 of Embodiment 2. As compared with the display device shown in FIG. 11 in which the pixel electrode PX and the charge-holding capacitor Cstg are formed above the adjacent gate wiring lines GL, the IPS-type liquid crystal display device according to Embodiment 5 is constructed between the pixel electrode PX and the counter electrode wiring line CT. The dielectric of the charge-holding capacitor Cstg has a laminated structure made of the gate insulating film GI made of SiN and the half-etched a-Si channel film AS. Owing to this laminated structure, it is possible to increase the charge-holding capacitance value per unit area. Accordingly, it is possible to narrow the width of the common electrode wiring line CT made of metal wiring line even in the IPS display device, whereby it is possible to realize a bright IPS type liquid crystal display device having a high aperture ratio.

Incidentally, in Embodiment 5, the laminated wiring structure made of the gate insulating film GI and the half-etched a-Si channel film AS is used as the dielectric film of the charge-holding capacitor Cstg. However, it goes without saying that, similarly to the liquid crystal display device of Embodiment 1 and the Embodiment 3, the liquid crystal display device according to Embodiment 5 can be applied to a structure in which both a laminated film made of the gate insulating film GI and the protective film PSV and the gate insulating film GI on which the half-etched a-Si channel film AS is disposed around the opening of the protective film PSV are used as a dielectric which constitutes the charge-holding capacitor Cstg.

Embodiment 6

Figure 22:
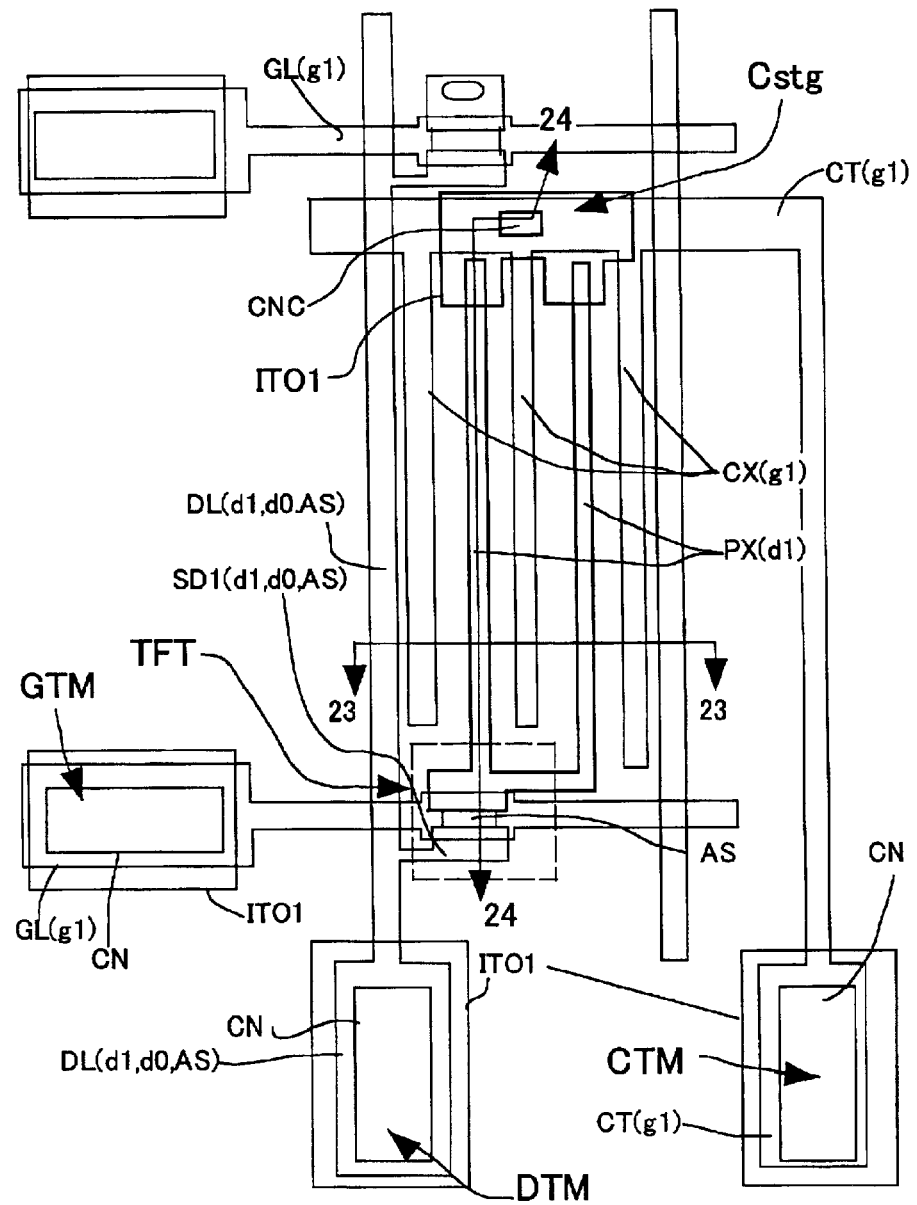
FIG. 22 is a plan view of a TFT substrate in an IPS type liquid crystal display device according to Embodiment 6 of the invention.
Figure 23:
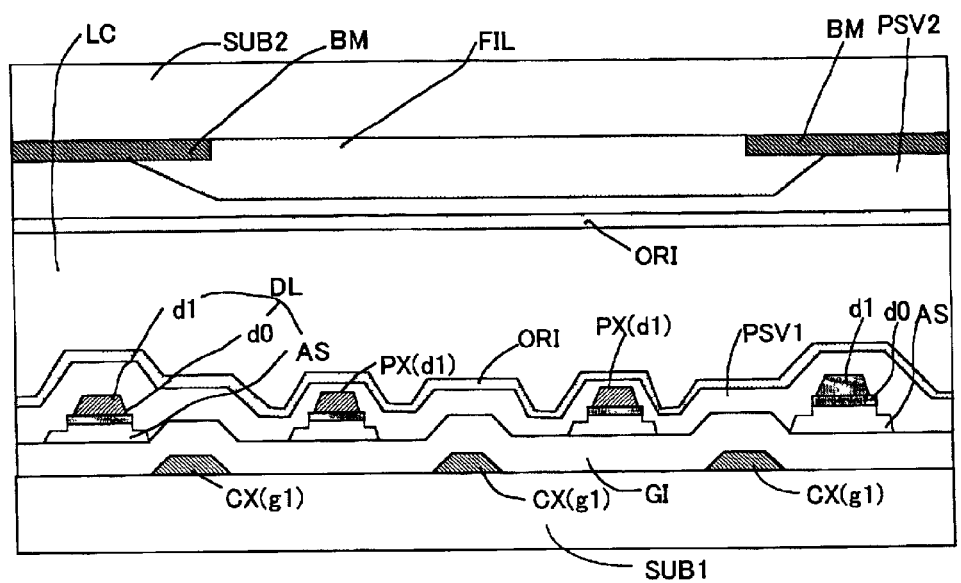
FIG. 23 is a cross-sectional view taken along line 23—23 of FIG. 22, showing a pixel area interposed between drain wiring lines in the liquid crystal display device according to Embodiment 6 of the invention.
Figure 24:
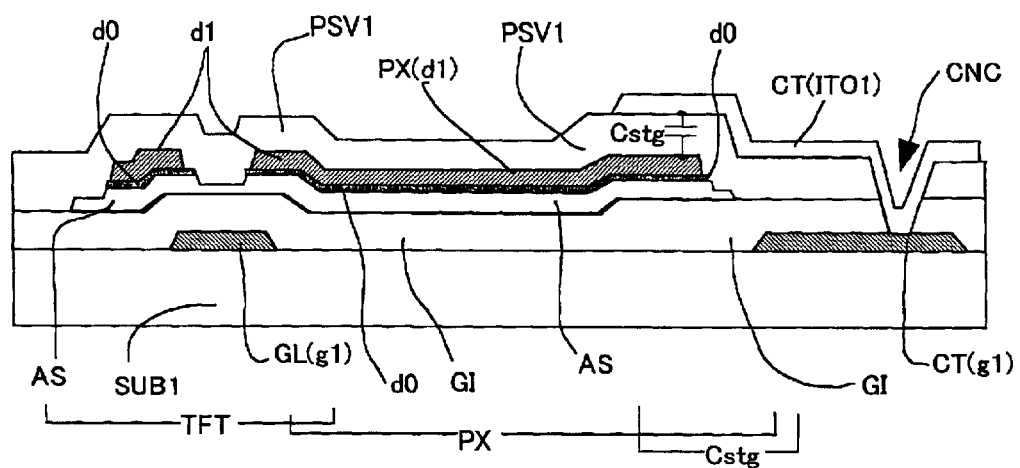
FIG. 24 is a cross-sectional view taken along line 24—24 of FIG. 22.

Embodiment 6 of the invention is shown in FIGS. 22 to 24. FIG. 22 shows the planar pattern of one pixel, and FIGS. 23 is a cross-sectional views taken along line 23—23 of FIG. 22 and FIG. 24 is a cross-sectional view taken along line 24—24 of FIG. 22. Embodiment 6 of the invention relates to an in-plane-switching (IPS) display mode of pixel structure, similarly to Embodiment 5.

The layout of one pixel is such that, as shown in FIG. 22, the pixel electrode PX and the common electrode CX are disposed in a comb-teeth shape. Accordingly, the display control of the pixel is performed by a lateral electric field which is applied to the liquid crystal LC from the pixel electrode PX toward the common electrode CX, as shown in the cross-sectional view of FIG. 20. The source electrode SD2 of the TFT is formed to be extended into the pixel area, thereby constituting a comb-teeth like electrode which serves as the pixel electrode PX. Similarly to the common electrode wiring line CT of Embodiment 5, the common electrode wiring line CT of Embodiment 6 is independent of the gate wiring line Gl and is formed in the same process as and of the same material as the gate wiring line GL, and is branched off in a comb-teeth shape in the pixel and forms the common electrodes CX disposed to be opposite to the pixel electrodes PX.

Unlike Embodiment 5, the charge-holding capacitor Cstg is formed of one electrode made of the pixel electrode PX and the other electrode constructed as the transparent conductive film ITO1 connected to the common electrode CX through the through-hole CNS. Similarly to the charge-holding capacitance line CL of Embodiment 4, the transparent conductive film of the pixel electrode PX works as a circuit wiring line constituting the charge-holding capacitor Cstg and is used as the upper electrode.

FIG. 23 is a cross-sectional view showing the drain wiring line DL, the comb-teeth-like pixel electrode PX and the comb-teeth-like common electrode CX. Each of the drain wiring line DL and the pixel electrode PX has a staircase-like cross-sectional shape in which the a-Si channel film AS, the a-Si contact film d0 and the metal film d1 such as Mo or Cr are laminated in this order on the gate insulating film GI. In particular, the a-Si channel film AS formed of an i-type a-Si film is wider than the metal film d1 of the pixel electrode PX, and serves as a dielectric and has the advantage of reducing the parasitic capacitance between the pixel electrode CX and the gate wiring line GL. Accordingly, it is possible to reduce display malfunction in a large-sized and high-resolution TFT liquid crystal display device. Moreover, as compared with the case where the a-Si films AS and d0 and the metal film d1 are separately processed through two photo-processes in a manner performed in the related art fabrication method, the a-Si channel film AS, the a-Si contact film d0 and the metal film d1 which form the staircase-like cross-sectional shape can be processed without being influenced by the deviation of photo-alignment between the a-Si channel film AS and the metal film d1, and micromachining is enabled with load capacitance and pixel capacitance being decreased. As a result, it is possible to realize a bright liquid crystal display device having a high aperture ratio.

FIG. 24 is a cross-sectional view of a portion which extends from the TFT through the pixel electrode PX to the section of the charge-holding capacitor Cstg of the common electrode wiring line CT. The pixel electrode PX is formed in the same process as and of the same material as the drain wiring line DL and has a laminated structure made of the a-Si channel film AS, the a-Si contact film d0 and the metal film d1, and is formed to be extended toward the common electrode wiring line CT, but not to overlap the common electrode wiring line CT.

The charge-holding capacitor Cstg has a lower electrode made of the metal film d1 formed to be extended from the source electrode SD2 and an upper electrode which is made of the transparent conductive film ITO1 connected to the common electrode wiring line CT via a through-hole CNC formed in a laminated film made of the gate insulating film GI and the protective film PSV made of an SiN film. The dielectric of the charge-holding capacitor Cstg is the protective film PSV which is made of a 200–600-nm-thick SiN film.

In the IPS display device according to Embodiment 6, although the pixel electrode PX is laminated on the a-Si channel film AS, the pixel electrode PX does not intersect the common electrode wiring line CT, whereby there does not occur an image retention phenomenon due to a variation in the capacitance of the a-Si film in the charge-holding state. Moreover, although in Embodiment 5, as shown in FIG. 20, the comb-teeth like pixel electrode PX is processed and disposed on the protective film PSV, Embodiment 6 has the SiN protective film PSV deposited on all the pixel electrodes PX by a CVD method, as shown in FIG. 23. Accordingly, the resultant steps are gentle, and shadows d0 not easily occur during rubbing processing for initial alignment of the molecules of the liquid crystal LC, whereby it is possible to realize a high contrast IPS type of liquid crystal display device.

As described above, in accordance with the invention, metal films for a-Si films and source and drain electrodes which constitute channel-etch type TFTs having a reversed staggered structure can be processed through one photo-process. Specifically, although the related art needs five photo-processes, the invention makes it possible to fabricate a TFT substrate through four photo-processes, thereby improving yield factor and reducing cost.

Moreover, if the above-described fabrication method using four photo-processes is used to form each drain wiring line of a TFT liquid crystal display device as a three-film structure made of an i-type a-Si film, an $n^{30}$-type a-Si film and a metal film on a gate insulating film, i.e., a staircase-like structure, or if each pixel electrode of an IPS type liquid crystal display device is formed as the above-described structure by using the above-described fabrication method, micromachining is enabled, and it is possible to realize a bright liquid crystal display device having a high aperture ratio. In addition, it is possible to reduce parasitic capacitance.

In addition, since the dielectric of the charge holding capacitor can use the gate insulating film or a laminated structure of the gate insulating film and the i-type a-Si film or the protective insulating film, it is possible to reduce the capacitance value per unit area and it is also possible to narrow the widths of the gate wiring lines, the charge-holding capacitance lines or the common electrode wiring lines. Accordingly, it is possible to provide a bright liquid crystal display device having a high aperture ratio.

While we have shown and described several embodiments in accordance with the present invention, it is understood that the same is not limited thereto but is susceptible of numerous changes and modifications as known to those skilled in the art, and we therefore d0 not wish to be limited to the details shown and described herein but intend to cover all such changes and modifications as are encompassed by the scope of the appended claims.

What is claimed is:

1. A liquid crystal display device comprising:
    a first insulating substrate and a second insulating substrate disposed to be opposite to the first insulating substrate;
    a liquid crystal layer being interposed between the first insulating substrate and the second insulating substrate;
    charges-holding capacitance sections, each of which has an upper electrode, a dielectric film and a lower electrode,
    wherein said dielectric film is formed between said lower electrode and the upper electrode at each of said charges-holding capacitance sections, and said upper electrode contacts with said dielectric film through a contact hole provided by perforating a protective film formed over said dielectric film, and a semiconductor layer provided between said protective film and said dielectric film is selectively etched to be only around said contact hole.

2. A liquid crystal display device according to claim 1, wherein the semiconductor layer is formed around the contact hole on said dielectric film.

3. A liquid crystal display device according to claim 1, wherein said upper electrode is a pixel electrode.

4. A liquid crystal display device according to claim 1, further comprising:

- a plurality of gate wiring lines, each of which is formed on the first insulating substrate and transmits a scanning signal;
- a gate insulating film being formed on the first insulating substrate and the plurality of gate wiring lines;
- a plurality of drain wiring lines, each of which is formed on the gate insulating film and transmits a video signal;
- a plurality of semiconductor layers being formed on the gate insulating film and at least under one of the plurality of drain wiring lines;
- thin film transistor sections, each of which has a semiconductor layer extended at least over a part of one of the plurality of gate wiring lines, a drain electrode formed of a part of the one of the plurality of drain wiring lines situated on said semiconductor layer, a source electrode formed on said semiconductor layer at an opposite side of the part of the one of the plurality of gate wiring liens to the drain electrode to be spaced from the drain electrode;
- a protective film covering the plurality of drain wiring lines, the source electrodes, and the drain electrodes; and
- a plurality of pixel electrodes, each of which is contacted with the source electrode of one of the thin film transistor sections, wherein said dielectric film is a gate insulating film of said thin film transistor sections.

* * * * *

UNITED STATES PATENT AND TRADEMARK OFFICE
CERTIFICATE OF CORRECTION

| | | |
|---|---|---|
| PATENT NO. | : 6,762,802 B2 | Page 1 of 1 |
| APPLICATION NO. | : 09/851942 | |
| DATED | : July 13, 2004 | |
| INVENTOR(S) | : Ono et al. | |

It is certified that error appears in the above-identified patent and that said Letters Patent is hereby corrected as shown below:

On the title page, Item (73) delete:

"Renesas Technology Corp., Tokyo (JP)"

and insert:

--Hitachi, Ltd., Tokyo (JP)--

Signed and Sealed this
First Day of April, 2014

Michelle K. Lee
*Deputy Director of the United States Patent and Trademark Office*